US011612084B1

(12) United States Patent
Swatko

(10) Patent No.: US 11,612,084 B1
(45) Date of Patent: Mar. 21, 2023

(54) MODULAR HEATSINK FOR VEHICLE COMPUTER COOLING ARCHITECTURE

(71) Applicant: Zoox, Inc., Foster City, CA (US)

(72) Inventor: Nicholas John Swatko, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 75 days.

(21) Appl. No.: 17/127,628

(22) Filed: Dec. 18, 2020

(51) Int. Cl.
*H05K 7/20* (2006.01)
*B60R 16/02* (2006.01)

(52) U.S. Cl.
CPC ..... *H05K 7/20872* (2013.01); *H05K 7/20854* (2013.01); *B60R 16/02* (2013.01)

(58) Field of Classification Search
CPC ............ H05K 7/20872; H05K 7/20854; B60R 16/02
USPC ...................................... 361/679.47
See application file for complete search history.

(56) References Cited

U.S. PATENT DOCUMENTS

| | | | | | |
|---|---|---|---|---|---|
| 5,279,029 | A * | 1/1994 | Burns | ................. | H01L 23/4334 264/102 |
| 5,377,077 | A * | 12/1994 | Burns | ................... | H01L 23/564 361/708 |
| 5,446,620 | A * | 8/1995 | Burns | ................... | H01L 25/105 257/713 |
| 5,632,462 | A * | 5/1997 | Kallas | ..................... | B60R 11/02 248/922 |
| 5,708,297 | A * | 1/1998 | Clayton | ................. | H01L 23/32 257/E25.011 |
| 5,726,492 | A * | 3/1998 | Suzuki | ................ | H01L 25/0657 257/723 |
| 6,113,047 | A * | 9/2000 | Wung | ................. | B60R 11/0235 248/917 |
| 6,119,765 | A * | 9/2000 | Lee | ..................... | H01L 23/4093 257/E23.102 |
| 6,386,413 | B1 * | 5/2002 | Twyford | ............. | B60R 11/0252 108/138 |
| 6,424,532 | B2 * | 7/2002 | Kawamura | ........... | H01L 23/367 361/708 |
| 6,449,156 | B1 * | 9/2002 | Han | ........................ | G11C 5/04 361/767 |
| 7,187,552 | B1 * | 3/2007 | Stewart | ............... | H01L 23/4093 257/E23.102 |
| 7,289,327 | B2 * | 10/2007 | Goodwin | .............. | H01L 23/473 257/E23.098 |
| 7,309,911 | B2 * | 12/2007 | Bartley | ................. | H01L 25/105 257/713 |
| 7,408,776 | B1 * | 8/2008 | Campbell | .......... | H05K 7/20509 257/E23.098 |
| 7,508,668 | B2 * | 3/2009 | Harada | ................. | H01L 23/473 361/689 |

(Continued)

*Primary Examiner* — Anatoly Vortman
(74) *Attorney, Agent, or Firm* — Lee & Hayes, P.C.

(57) ABSTRACT

A thermal management system may cool at least a portion of a computer system with one or more cooling systems. The thermal management system can include one or more modular heatsink assemblies. The modular heatsink assemblies can include scalable heat spreader panels that are thermally coupled to a portion of the one or more cooling systems. The modular heatsink assembly can be positioned above and/or adjacent to a computer component, such as a dual in-line memory module. The scalable heat spreader panels are shaped to fit in between and to the sides of the computing component to draw heat away from the computing component.

20 Claims, 11 Drawing Sheets

(56) References Cited

U.S. PATENT DOCUMENTS

| | | | | |
|---|---|---|---|---|
| 7,639,498 B2* | 12/2009 | Campbell | ......... | H05K 7/20772 |
| | | | | 165/80.4 |
| 7,876,564 B2* | 1/2011 | Monh | .................. | H01L 23/427 |
| | | | | 174/15.2 |
| 8,111,515 B2* | 2/2012 | Akram | ................ | H01L 25/0657 |
| | | | | 361/717 |
| 8,369,091 B2* | 2/2013 | Campbell | ................. | F28F 3/12 |
| | | | | 257/714 |
| 8,625,280 B2* | 1/2014 | Rau | .......................... | G06F 1/20 |
| | | | | 361/699 |
| 8,634,194 B2* | 1/2014 | Yamaura | ............ | H05K 7/20927 |
| | | | | 361/709 |
| 9,370,122 B2* | 6/2016 | Chainer | ................. | G06F 3/044 |
| 10,705,578 B2* | 7/2020 | Franz | ................ | H01L 27/10897 |
| 2020/0042053 A1* | 2/2020 | Cheng | ............... | H05K 7/20336 |

* cited by examiner

MODULAR HEATSINK FOR VEHICLE COMPUTER COOLING ARCHITECTURE

BACKGROUND

Computers generate heat during operation and may require cooling to remain operational for extended periods of time. In addition, heat generated from the computer may become trapped in an area in which the computer operates. For instance, a computer located in a vehicle may generate sufficient amounts of heat to render air cooling ineffective. In a semi-autonomous vehicle and/or an autonomous vehicle, the computer may control aspects of the vehicle that would be lost if the computer shuts down due to heat. Existing computer cooling systems lack the robustness and structural integrity needed for automotive environments.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
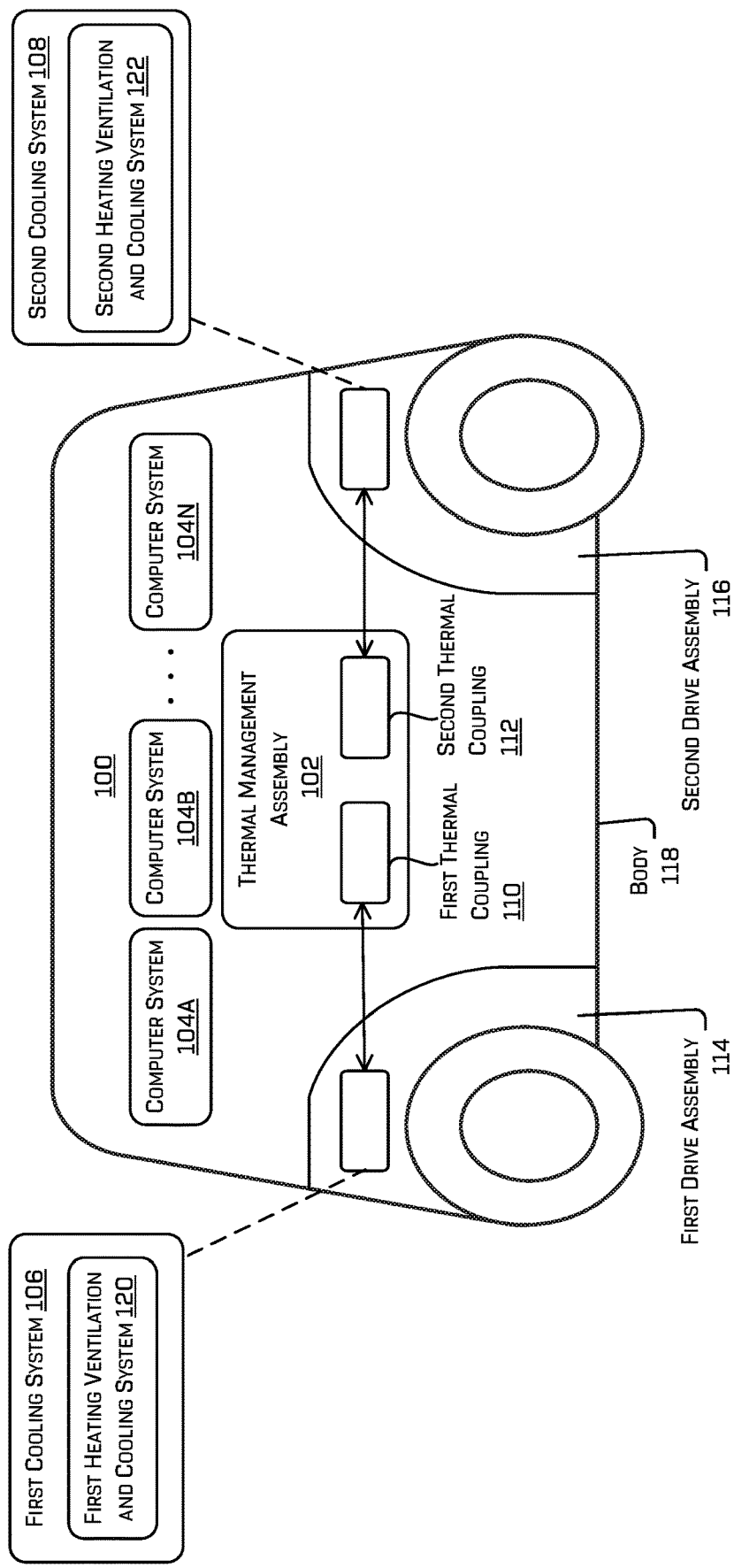
FIG. 1 is a schematic diagram of an example vehicle, in which an example thermal management system cools one or more computer systems of the vehicle.

Modern vehicles can include one or more computer systems to control aspects of vehicle operation. As these computer systems become more powerful, as in the case of semi-autonomous or autonomous vehicles for example, the amount of heat generated by these computing systems can be considerable. The vehicle may also include a heating ventilation and air conditioning (HVAC) system for controlling the temperature and/or humidity inside an occupant compartment of the vehicle for the comfort of the occupant (e.g., a passenger). In a semi-autonomous vehicle and/or an autonomous vehicle, the computer may control aspects of the vehicle that would be lost if the computer shuts down or fails due to heat, vibration, or other causes.

This application describes techniques for cooling at least a portion of a vehicle computer system using a thermal management system. The thermal management system may include one or more modular heatsink assemblies. The modular heatsink assemblies can include scalable heat spreaders that can be thermally coupled to a portion of the one or more cooling systems. The modular heatsink assembly can be positioned above and/or on one or both sides of a computer component. The scalable heat spreaders can be shaped to fit in between and on one or both sides of the computer component to draw heat away from the computer component. The modular heatsink assembly can also help hold the computer component in position, absorb vibrations, and/or protect the computing components from damage during operation of the vehicle and/or during collision.

In some examples, the computing components cooled by the modular heatsink assemblies may comprise substantially planar cards or boards having a bank of integrated circuits disposed on one or both faces thereof such as a memory module. By way of example and not limitation, other computing components that can be cooled by the modular heatsink assemblies and/or components of the thermal management system described herein include other memory devices, central processor units, graphics processing units, voltage regulators, ethernet controllers, chipsets, solid-state drives, power supplies, image processing units, network interface cards, or any other computing component that generates heat.

The thermal management system may employ air and/or liquid cooling to cool the vehicle computing system. For instance, in some examples, fluid from a cooling system of the vehicle may be used to provide direct or indirect cooling to all or a portion of a vehicle computer system via the thermal management system. In that case, the thermal management system may be in fluid communication with the cooling system to supply fluid from the cooling system to at least a portion of the computer system. In some examples, a manifold transfers fluid from the cooling system to a cooling block coupled to a component of the computer system. In various examples, the manifold may direct fluid to multiple cooling blocks to directly or indirectly cool different components of the computer system. In some examples, a single cooling block may be configured to cool multiple components of the computer system by providing a fluid cooled surface of the cooling block to contact, be proximate to, and/or be thermally coupled to, the multiple components. Cooling a computer system with fluid from a cooling system as described herein can divert heat energy from the computer system thereby mitigating heat related computer failure and/or improving computer performance, thereby increasing the reliability and safety of the vehicle. Additionally, in some examples, multiple vehicle cooling systems and/or multiple thermal management assemblies may be used to provide redundant cooling of the vehicle computing systems, thereby further increasing the reliability and safety of the vehicle.

In various examples, the cooling system may be associated with a vehicle. For example, the thermal management system may be configured to supply fluid from a cooling system (e.g., a heating ventilation and air condition system of the vehicle, a radiator) to at least a portion of the computer system. The cooling system can generally represent a component or system of components that removes heat from a fluid by, for example, a vapor-compression cycle, an absorption refrigeration cycle, and/or liquid/solid interface (e.g., via a radiator). In examples when the cooling system is part of an autonomous vehicle, managing heat within a housing of the computer system using the cooling techniques described herein contributes to safe operation of the autonomous vehicle by achieving and/or maintaining a desired temperature associated with the computer system.

The thermal management system may employ active or passive air cooling to cool one or more components of the vehicle computer system in addition to or instead of using the fluid from the cooling system of the vehicle.

In some examples, modular heatsink assemblies according to this application can include a first heat spreader panel (also referred to as "first panel") or heat sink positioned on a first side of the at least one integrated circuit and a second heat spreader panel (also referred to as "second panel") positioned on a second side of the at least one integrated circuit, wherein the first heat spreader panel is coupled to the second heat spreader panel. At least one of the heat spreaders can be thermally coupled to a portion of the cooling system of the vehicle, such as a cooling block or manifold. The heat spreader can be attached directly to the cooling system or can be thermally coupled using a heat strap or fluidly coupled to the cooling system. The modular heatsink assembly can include additional heat spreaders to accommodate the number of integrated circuits in the computer component. The heat spreader panels, also referred to as just heat spreaders, can be constructed from materials with a relatively high thermal conductivity including metals such as aluminum, magnesium, copper, etc. and/or crystal structures such as graphite, graphene, and so on.

In some examples, the heat spreader includes a plate having a first side, a second side, a top and a bottom, a lip protruding from the first side of the plate adjacent the top of the plate to abut a second instance of the heat spreader, the lip configured to space the second instance of the heat spreader from the heat spreader to receive a computing component between the heat spreader and the second instance of the heat spreader, and an aperture for connection of the heat spreader to the second instance of the heat spreader. The aperture can include a self-fastening device such as a swage nut to help hold a bolt or other fastener. The heat spreaders can be fastened together to sandwich the integrated circuit in order to protect functioning of the computer. In some examples, a thermally conductive material can be disposed between the heat spreader and the integrated circuit to increase thermal conductivity and reduce damage caused by vibrations. Examples of thermally conductive materials include thermal grease, thermal tape, and other materials with relatively high thermal conductivity (e.g., of between 0.3-5.0 W/mK inclusive).

In other examples, the panels can be used to protect integrated circuits in a vehicle computer system, but may or may not draw significant amounts of heat away from the components. The panels can be constructed from a material that is less thermally conductive and more rigid than the materials described above such as plastic, rubber, fiberglass. The each panel can interact with the computer component and other instances of the panel in the same manner as the heat spreader panels.

The techniques discussed herein may also improve a functioning of a vehicle or machine that depends on a computer system for operation. For instance, cooling a computer system using the techniques described herein can enable a computer system (e.g., a vehicle computer system, a machine vision computer system, and the like) to provide functionality while mitigating deleterious effects caused by an environment in which the computer is located and regardless of whether one of the two cooling systems fails. In some examples, the thermal management system may cool a computer system in a hot climate (e.g., an area having an ambient temperature above the dew point) and/or mounted in an enclosed space (e.g., within a sealed housing, inside a body of a vehicle, and/or an area with little to no air movement). In addition to preserving performance of a computer system in various environments, implementing the cooling techniques described herein can enable the use of more sophisticated computational resources (e.g., a processor unit that performs greater number of computations, more processors, more components, etc.) to improve functioning and performance of the computer system. For example, a more sophisticated or more robust computational resource may require additional cooling support than may otherwise be unobtainable, especially in the context of use within an automated vehicle. The modular heatsink assembly described herein can provide robust and reliable cooling to a computer component, such as a bank of integrated circuits, while also protecting the computer component from damage caused by vibrations and other vehicle movements.

The techniques described herein may be implemented in a number of ways. Example implementations are provided below with reference to the following figures. Although discussed in the context of an autonomous vehicle, the methods, apparatuses, and systems described herein may be applied to a variety of systems (e.g., a manually driven vehicle, a sensor system, or a robotic platform), and are not limited to autonomous vehicles. In another example, the techniques may be utilized in an aviation or nautical context, or in any system using machine vision (e.g., in a system using image data).

FIG. 1 is an illustration of an example vehicle 100, in which an example thermal management system 102 cools a computer system 104A, 104B, up to an Nth computer system 104N (collectively "computer systems 104"), where N can be any integer greater than or equal to 1. While described as a separate system, in some examples, the thermal management techniques described herein may be implemented by other vehicle systems, components, and/or computing devices. For example, and as will be described in further detail with regard to FIG. 10, thermal management techniques described herein may be implemented at least partially by or in association with a thermal management system 1030 comprising one or more manifolds, cooling blocks, heatsinks, heat pipes, and/or fluid circuits.

In various examples, a first cooling system 106 and/or a second cooling system 108 of the vehicle 100 may cool at least a portion of one or more of the computer systems 104 of the vehicle 100. In some examples, a first fluid from the first cooling system 106 and/or a second fluid from the second cooling system 108 of the vehicle 100 is supplied to the thermal management system 102 via a first thermal coupling 110 and/or a second thermal coupling 112. In some examples, the first cooling system 106 may be coupled to (e.g. attached at least partially within) a first drive assembly 114 while the second cooling system 108 may be coupled to a second drive assembly 116. In various examples, each of the first drive assembly 114 and the second drive assembly 116 may be detachably coupled to a body 118 of the vehicle 100.

Generally, the thermal management system 102 is configured to cool one or more of the computer systems 104 by transferring thermal energy from one or more of the computer systems 104 to the first cooling system 106 and/or the second cooling system 108. In some examples, the first thermal coupling 110 and/or the second thermal coupling 112 may comprise one or more a heat pipes and/or fluid circuits to transfer thermal energy away from the one or more computer systems 104 and to at least one of the first cooling system 106 or the second cooling system 108. Thus, the first thermal coupling 110 and the second thermal coupling 112 may be configured to establish, maintain, and/or disconnect thermal communication (e.g., when heat straps are used) and/or fluid communication (e.g., when a fluid circuit is used) with the first cooling system 106 coupled to the first drive assembly 114 and/or the second cooling system 108 coupled to the second drive assembly 116.

In various examples, the thermal management system 102 may be supplied fluid from one or both of the first cooling system 106 and the second cooling system 108 to one or more of the computer systems 104 via the first thermal coupling 110 and/or the second thermal coupling 112. In some examples, the thermal management system 102 is in fluid communication with the first cooling system 106 and the second cooling system 108 to cool the one or more computer systems 104 using both the first fluid and the second fluid. In other examples, such as in the case of failure of one of the cooling systems, the thermal management system 102 is in fluid communication with one of the first cooling system 106 or the second cooling system 108 to cool the one or more computer systems 104 using either the first fluid or the second fluid. In some examples, the first fluid from the first cooling system 106 and the second fluid from the second cooling system 108 are closed systems isolated from each other, while in other examples the first fluid from the first cooling system 106 and the second fluid from the second cooling system 108 may be shared (i.e., the cooling systems may be in fluid communication with each other).

In some examples, substantially all major systems of the vehicle 100 may be located on each of the first drive assembly 114 and the second drive assembly 116. For instance, each of the first drive assembly 114 and the second drive assembly 116 may include some or all of the following: a propulsion system, power supply system and related electronics, steering system, braking system, suspension system, heating ventilation and air conditioning (HVAC) system, and related controls and actuators for the forgoing systems. For instance, the first cooling system 106 may comprise a first HVAC system 120 and the second cooling system 108 may comprise a second HVAC system 122. In various examples, the first drive assembly 114 and the second drive assembly 116 are configured to individually detach from the body 118 of the vehicle 100. In some examples, the first thermal coupling 110 and the second thermal coupling 112 represent interfaces and/or connectors that enable safe thermal connection/disconnection between a respective cooling system and the thermal management system 102. In this way, one of the first drive assembly 114 or the second drive assembly 116 may be detached from the body of the vehicle 100 without interrupting fluid communication within the thermal management system.

Figure 2:
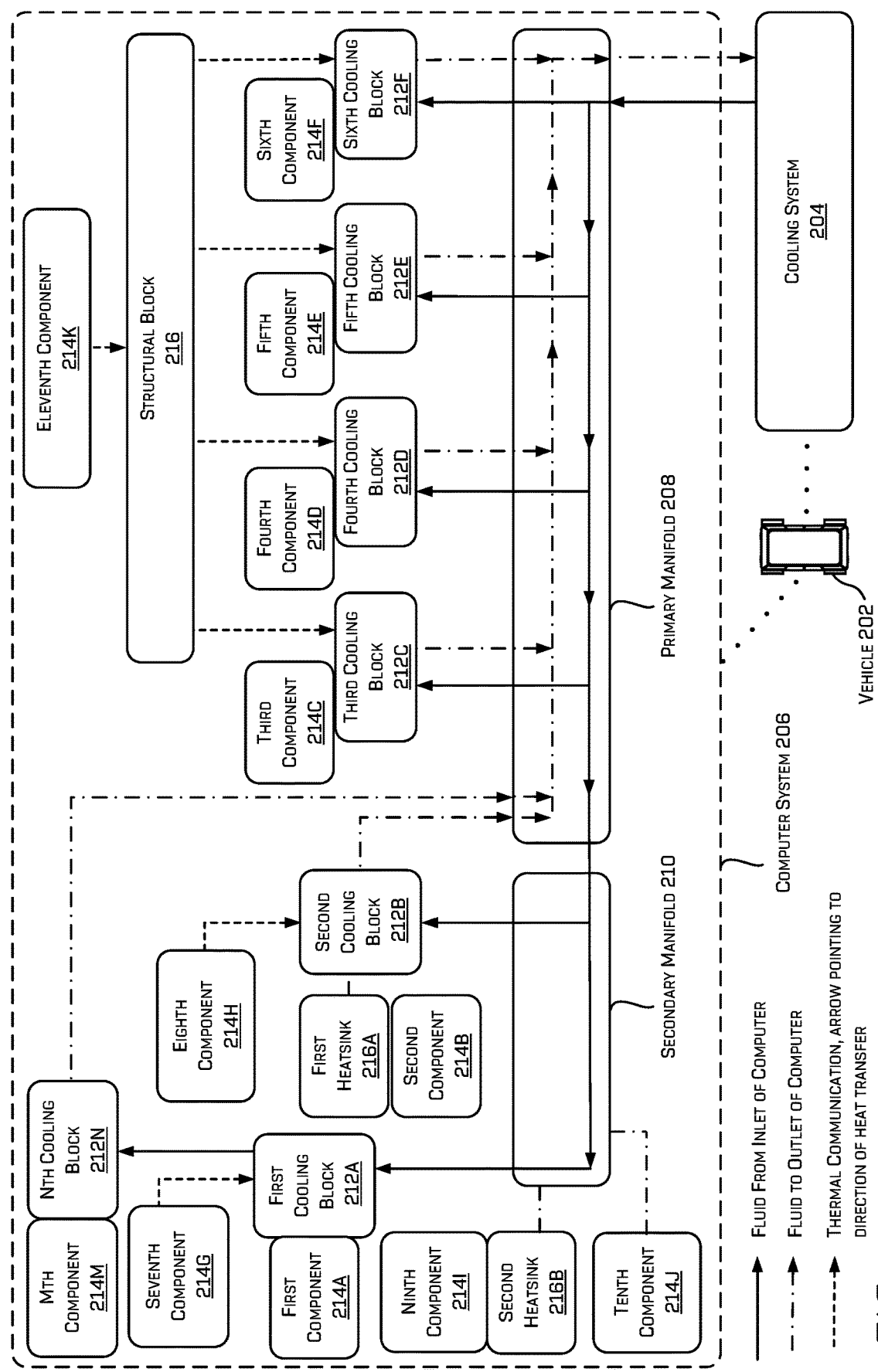
FIG. 2 is a block diagram of another example vehicle, in which an example thermal management system cools a computer system of the vehicle.

FIG. 2 is a block diagram of another example vehicle 202, in which an example thermal management system cools a computer system of the vehicle 202. While described as a separate system, in some examples, the thermal management techniques described herein may be implemented by other vehicle systems, components, and/or computing devices. For example, and as will be described in further detail with regard to FIG. 10, thermal management techniques described herein may be implemented at least partially by or in association with a thermal management system 1030 comprising one or more manifolds, cooling blocks, heat-sinks, heat pipes, and/or fluid circuits.

In various examples, a cooling system 204 of the vehicle 202 may cool at least a portion of a computer system 206 of the vehicle 202. In some examples, the cooling system 204 may comprise an HVAC system of the vehicle 202. In some examples, fluid from the cooling system 204 of the vehicle 202 is supplied to a primary manifold 208 for delivery to a secondary manifold 210 and/or one or more cooling blocks 212. In this example, the cooling system 204 includes a first cooling block 212A, a second cooling block 212B, up to an Nth cooling block 212N (collectively "cooling blocks 212"), where N can be any integer greater than or equal to 1. The cooling blocks 212 may be used to cool components 214 of the computer system 206. In the illustrated example, the computer system includes a first component 214A, a second component 214B, up to an Mth component 214M (collectively "components 214"), where M can be any integer greater than or equal to 1. In some examples, the number of components M may not be the same as the number of cooling blocks N.

In some examples, the fluid (e.g., vehicle coolant) of the cooling system 204 is supplied to the primary manifold 208 via a fluid circuit (e.g., a conduit) and flows within a portion of the primary manifold 208 to openings that transfer the fluid to the secondary manifold 210 and/or the cooling blocks 212C, 212D, 212E, and 212F. In some examples, the primary manifold 208 may transfer the fluid to the secondary manifold 210 and/or the cooling blocks 212 either by way of one or more conduits and/or by transferring the fluid directly to openings associated with the secondary manifold 210 and/or the cooling blocks 212C, 212D, 212E, and 212F (e.g., without using a conduit). In some examples, the cooling system 204 may receive used/warm fluid (e.g., fluid that has passed through a manifold and/or a cooling block) from the primary manifold 208, may cool the fluid, and may return the cooled fluid to the primary manifold 208 as fresh fluid (e.g., cool coolant).

In some examples, the primary manifold 208 may be configured to receive the fluid from the cooling blocks 212C, 212D, 212E, and 212F, and transfer the fluid to the cooling system 204 to cool the fluid. In such examples, the primary manifold 208 is part of a closed loop system that includes at least the cooling system 204 and the cooling blocks 212. In some examples, the primary manifold 208 may direct fluid from the cooling system 204 to multiple cooling blocks (e.g., cooling blocks 212C, 212D, 212E, and 212F) in parallel to supply fluid at a first temperature to each of the multiple cooling blocks at substantially a same time and without first passing through another of the multiple cooling blocks.

In some examples, the primary manifold 208 may transfer fluid to a fluid circuit (e.g., a conduit) coupled to an additional cooling block (not shown) and/or an additional manifold (not shown). For instance, the primary manifold 208 may use the fluid circuit to transfer the fluid to the additional cooling block and/or the additional manifold.

In some examples, the primary manifold 208, the secondary manifold 210, and/or the cooling blocks 212 may be coupled to and/or be proximate to one or more of the components 214. For instance, any of the components 214 may comprise any one of: a central processor unit, a graphics processing unit, a voltage regulator, an ethernet controller, a chipset, a solid-state drive, a power supply, a memory device, an image processing unit, or a network interface card, and so on. As illustrated in FIG. 2, the components 214B, 214G, 214H, 214I, 214J, and 214K are associated with thermal communication (e.g., heat transfer using a heatsink, the primary manifold, the secondary manifold, and/or heat pipes) while the components 214A, 214C, 214D, 214E, 214F, and 214M are associated with respective cooling blocks 212 which are in fluid communication (e.g., a flow of fluid) with the cooling system 204. In addition, or in the alternative, one or more components 214 (e.g., the tenth component 214K) may be coupled to a structural block 216. In some examples, the structural block 216 may be configured to cool the one or more components 214 of the computer system 206 (e.g., by transferring heat through contact with at least one of the primary manifold 208 or the secondary manifold 210). As described below, the structural block 216 may be configured to provide rigidity to a housing of the computer system 206 and/or one or more component 214 of the computer system 206.

In various examples, the primary manifold 208 and/or the secondary manifold 210 may comprise one or more portions that cool the components 214 of the computer system 206 located near or in contact with the primary manifold 208 and/or the secondary manifold 210. For instance, the primary manifold 208 and/or the secondary manifold 210 may comprise metal (e.g., aluminum, magnesium, copper, an alloy, a combination thereof, and so on) to facilitate heat transfer between the fluid and the primary manifold 208 and/or the secondary manifold 210. The one or more portions of the primary manifold 208 and/or the secondary manifold 210 may also or instead cool an ambient temperature within the housing of the computer. In some examples, the primary manifold 208 and the secondary manifold 210 may comprise a single manifold (e.g., a manifold manufactured as a single unit).

In some examples, fluid from the cooling system 204 of the vehicle 202 is supplied to a primary manifold 208 for delivery to a secondary manifold 210 and/or one or more cooling blocks 212. In this example, the cooling system 204 includes a first cooling block 212A, a second cooling block 212B, up to an Nth cooling block 212N (collectively "cooling blocks 212"), where N can be any integer greater than or equal to 1. The cooling blocks 212 may be used to cool components 214 of the computer system 206. In the illustrated example, the computer system includes a first component 214A, a second component 214B, up to an Mth component 214M (collectively "components 214"), where M can be any integer greater than or equal to 1. In some examples, the number of components M may not be the same as the number of cooling blocks N.

In various examples, the thermal management system may comprise a heatsink located between at least one of the primary manifold 208 or the secondary manifold 210 and an associated component (e.g., components 214B or 214I) to provide thermal cooling of the respective component of the computer system 206. In this example, the cooling system 204 includes a first heatsink 218A and a second heatsink 218B, up to an Oth heatsink (collectively "heatsinks 218"), where O can be any integer greater than or equal to 1. In some examples, the number of components M and number of cooling blocks N may not be the same as the number of heatsinks O.

Generally, the heatsink 218 is configured to transfer heat from some of the components 214 of the computer system 206 to at least one of: the primary manifold 208, the secondary manifold 210, a cooling block 212, or a housing of the computer system 206. In some examples, the heatsink 218 may be configured to extend from a portion of a cooling block and/or manifold to a component of the computer system 206. For instance, the second cooling block 212B may connect to the component 214B (e.g., a memory device such as dynamic random-access memory) via a first heatsink 218A. In another instance, the secondary manifold 210 may connect to the component 214I (e.g., a memory device or other integrated circuit bank) via a second heatsink 218B.

Other heatsinks 218 can be deployed throughout the thermal management system. As depicted in FIG. 2, the component 214K (e.g., a solid-state hard drive or other solid-state device) may, in some examples, be thermally connected to the structural block 216 via a heatsink which in turn is thermally connected to the primary manifold 208. In various examples, the component 214K may be thermally connected to the housing of the computer system to direct heat from the component 214K to the housing.

As shown in FIG. 2, the secondary manifold 210 may be configured to transfer fluid to cooling blocks 212A and 212B, though more or fewer cooling blocks may be used with the secondary manifold 210 in other examples. Additionally, or alternatively, the secondary manifold 210 may be configured to attract heat from components 214I and 214J of the computer system 206. Here, the components 214I and 214J may be thermally connected to the secondary manifold 210 through physical contact for cooling via the one or more portions of the secondary manifold 210. As illustrated, unlike the primary manifold 208 which receives fluid from the cooling blocks 212C, 212D, 212E, and 212F, in some examples the secondary manifold 210 delivers fluid to cooling block 212A and 212B without receiving the fluid back from the cooling blocks 212A and 212B. In some examples, fluid flows through the cooling block 212A to a cooling block 212N and fluid also flows from the cooling block 212B to the primary manifold 208. In various examples, the cooling block 212N may be associated with a component 214M (e.g., a power supply) of the computer system 206.

Generally, fluid enters the computer system 206 at the primary manifold 208 at a first temperature and increases in temperature as the fluid comes in contact with the secondary manifold 210 and/or the cooling blocks 212. Thus, fluid exits the computer system 206 at the primary manifold 208 at a second temperature that is different from the first temperature. For this reason, fluid flowing through the fifth cooling block 212N may be at a higher temperature compared to a temperature of the fluid flowing through the primary manifold 208. By distributing fluid as described herein, cool fluid reaches the components generating the most heat first and then transfers the fluid to components that generally require less cooling. For example, a temperature of fluid at the cooling block 212N may be warmer than a temperature of fluid at the cooling block 212C. Accordingly, the component 214M (e.g., a power supply) may be cooled with warmer fluid than the component 214C (e.g., a graphic processing unit).

FIG. 2 also depicts a thermal connection between the seventh component 214G and (e.g., a first voltage regulator) cooling block 212A and the eight component 214H and cooling block 212B (e.g., a second voltage regulator). Each of the component 214G and the component 214H may be cooled based at least in part on a proximity to the respective cooling block (e.g., the cooling blocks 212A and 212B) which absorbs thermal energy emitted from the component 214G and the component 214H. By way of example and not limitation, a heatsink may also extend from one of the cooling block 212A or the cooling block 212B to at least one of the component 214G or the component 214H.

Additionally, FIG. 2 illustrates thermal communication between the cooling blocks 212C, 212D, 212E, and 212F and the structural block 216. Here, the structural block 216 (e.g., a block of aluminum, magnesium, or copper) may have slots for coupling to at least a portion of the cooling blocks 212C, 212D, 212E, and 212F to secure one of the cooling blocks 212C, 212D, 212E, and 212F relative to a housing of the computer system 206 and/or relative to another of the cooling blocks 212C, 212D, 212E, and 212F. By way of example and not limitation, the structural block 216 may comprise a heat-conductive metal plate with slots for receiving multiple cooling blocks (e.g., cooling blocks 212C, 212D, 212E, and 212F).

In some examples, the structural block 216 may be configured to cool the component 214K of the computer system 206. Here, the component 214K may be cooled by the structural block 216 which in turn is cooled by one or more of the cooling blocks 212C, 212D, 212E, and 212F. In some examples, the structural block 216 may be coupled to, and cooled by, the primary manifold 208. In some examples, the structural block 216 may be coupled to a heatsink that draws heat from the structural block 216 to the primary manifold 208, the cooling blocks 212C, 212D, 212E, and 212F, and/or a housing of the computer system 206. By way of example and not limitation, the heatsink may be coupled to a chipset of the computer system 206, though other components may also be cooled by the heatsink. In this way, the thermal management system may be configured to cool the computer system 206 with both liquid cooled elements (e.g. the cooling blocks) as well as thermal cooling by components that are thermally coupled to the liquid cooled elements.

As mentioned above, fluid from the cooling system 204 typically heat up as the fluid passes through and/or around different heat-generating components of the computer system 206. For this reason, a component requiring more cooling (e.g., a component that uses more power than another component) may be located closer to the source of cool fluid while a component requiring less cooling (e.g., a component that uses less power than another component) may be located further from the source of cool liquid. Additionally, or in the alternative, one or more components that generate heat during operation may be cooled by thermal connections (e.g., a heatsink, a heat pipe, heat tape, thermal grease, and the like), the primary manifold 208, and/or the secondary manifold 210.

Figure 3:
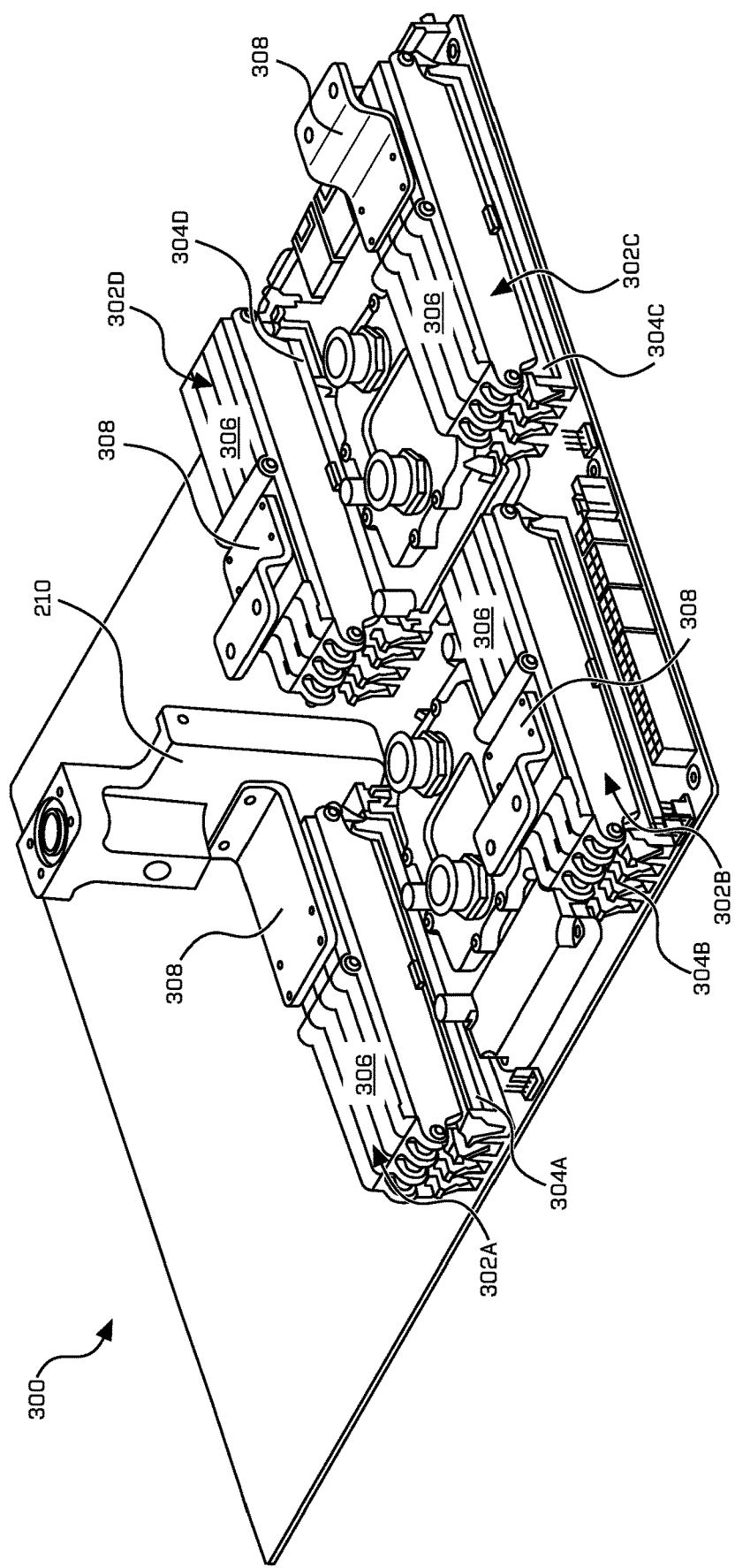
FIG. 3 is a perspective view of an example thermal management system incorporating a modular heatsink assembly.

FIG. 3 shows a portion of an example thermal management system 300. The thermal management system 300 of the depicted example includes four modular heatsink assemblies 302A, 302B, 302C, 302D (collectively "heatsink assembly 302") that are thermally coupled to the cooling system 204. Each heatsink assembly 302 is configured to draw heat from a component of the computer system 304A, 304B, 304C, 304D (collectively "component 304"). For example, the modular heatsink assembly 302A is positioned above and around component 304A and draws heat away from that component 304A. In some examples, the component 304 comprises at least one integrated circuit. Example components 304 include a dual in-line memory module, video cards, or any other component comprising a printed circuit board. In some examples, the component 304 comprises a series of two or more integrated circuits. The modular heatsink assembly 302 can comprise two or more heat spreaders 306 coupled together to cover at least a portion of the component 304. In examples, the number of heat spreaders 306 is scalable to accommodate the number integrated circuits in the component. In the depicted example, the components 304 include three integrated circuits and the modular heatsink assembly 302 includes four heat spreaders 306. In some example, the modular heatsink assembly 302 includes a number of heat spreaders 306 equal to one more than the number of integrated circuits. In other examples, the modular heatsink assembly 302 can have a number of heat spreaders equal to or less than the number of integrated circuits of the component.

The heat spreaders 306 can be thermally coupled to the cooling system 204. In the depicted example, the heat spreaders 306 are coupled to a portion of the cooling system 204 using a heat strap 308. The heat strap 308 is coupled to the heat spreaders 306 at a first end and a portion of the cooling system 204 at a second end. The heat strap 308 is configured to draw heat away from the heat spreaders 306 toward the cooling system 204. The heat strap 308 can be formed from a thermally conductive metal material such as aluminum, magnesium, copper, gold, iron, or steel. The metal heat strap could be formed from a metal sheet or wire. In other examples, the heat strap 308 can be formed from graphite or a bundle of fibers. In the depicted example, the heat strap 308 is coupled directly to each of the heat spreaders 306. In other examples, the heat strap 308 can be coupled to a subset or only one of the heat spreaders 306 in a modular heatsink assembly 302.

Each modular heatsink assembly 302 can be coupled to any portion of the cooling system 204. In the example depicted in FIG. 3, modular heatsink assembly 302A is thermally coupled to the secondary manifold 210 of the cooling system 204. The heat strap 308 of the modular heatsink assembly 302A is attached at a first end to the heat spreaders 306 and at a second end to the secondary manifold. Modular heatsink assemblies also can be coupled to a cooling block 212 as shown in FIGS. 4A and B, discussed further below.

In some examples, the modular heat assembly 302 can be coupled to the cooling system 204 via another structure of the vehicle rather than using a heat strap. For example, the heat spreaders 306 of the modular heat assembly 302 can be coupled to a housing of the computer system 206 or the structural block 216. The heat spreaders 306 can be attached to any structure that is thermally coupled to the cooling system 204. In some examples, the heat spreaders 306 can be configured to accommodate a cooling pipe running adjacent to or through some or all of the heat spreaders. For example, the heat spreader panels can each include a channel or grove through which a conduit can be inserted. The conduit can be fluidly connected to the cooling system to deliver cool fluid directly to the heat spreader panels. In some examples, the heat spreaders 306 can be directly coupled to a portion of the cooling system 204 rather than being coupled via a heat strap or other structure. For example, the heat spreaders 306 can be coupled directly to a manifold and/or cooling block of the cooling system.

Figure 4A:
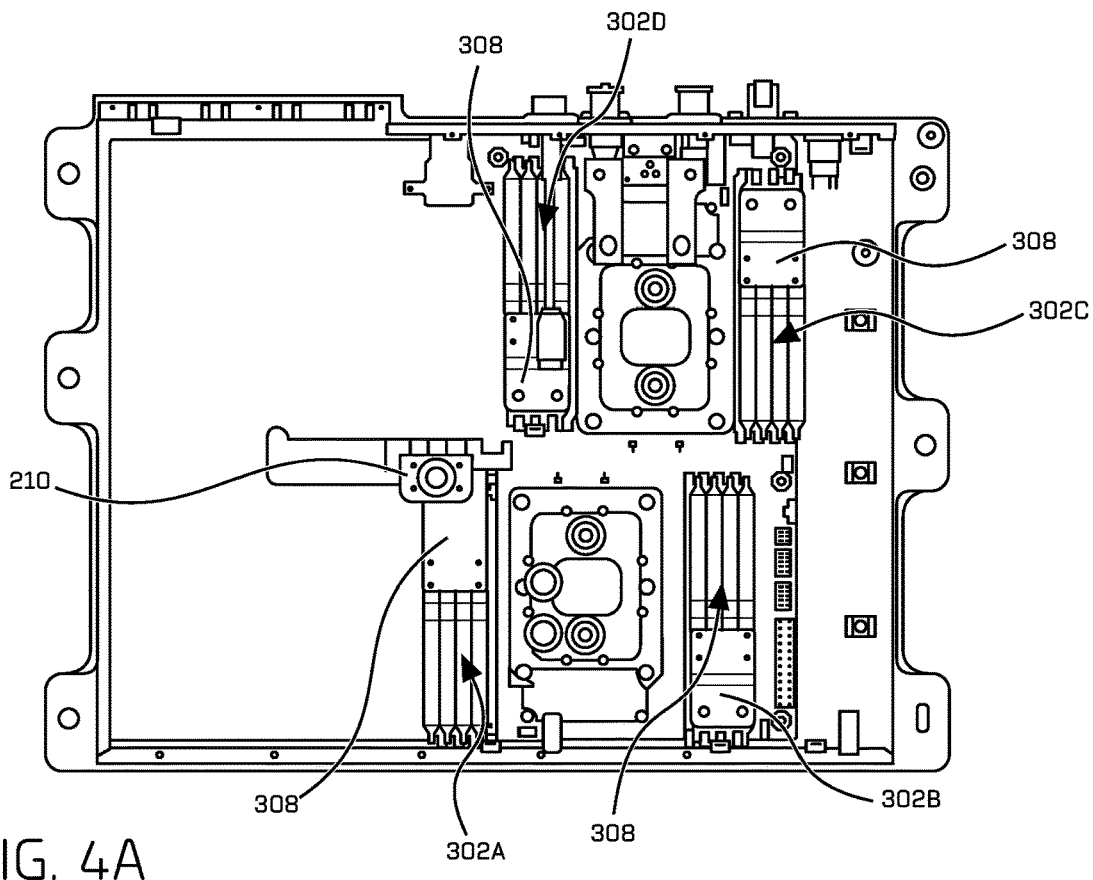
FIG. 4A is a top view of the thermal management system of FIG. 3 with the cooling block omitted for clarity.
Figure 4B:
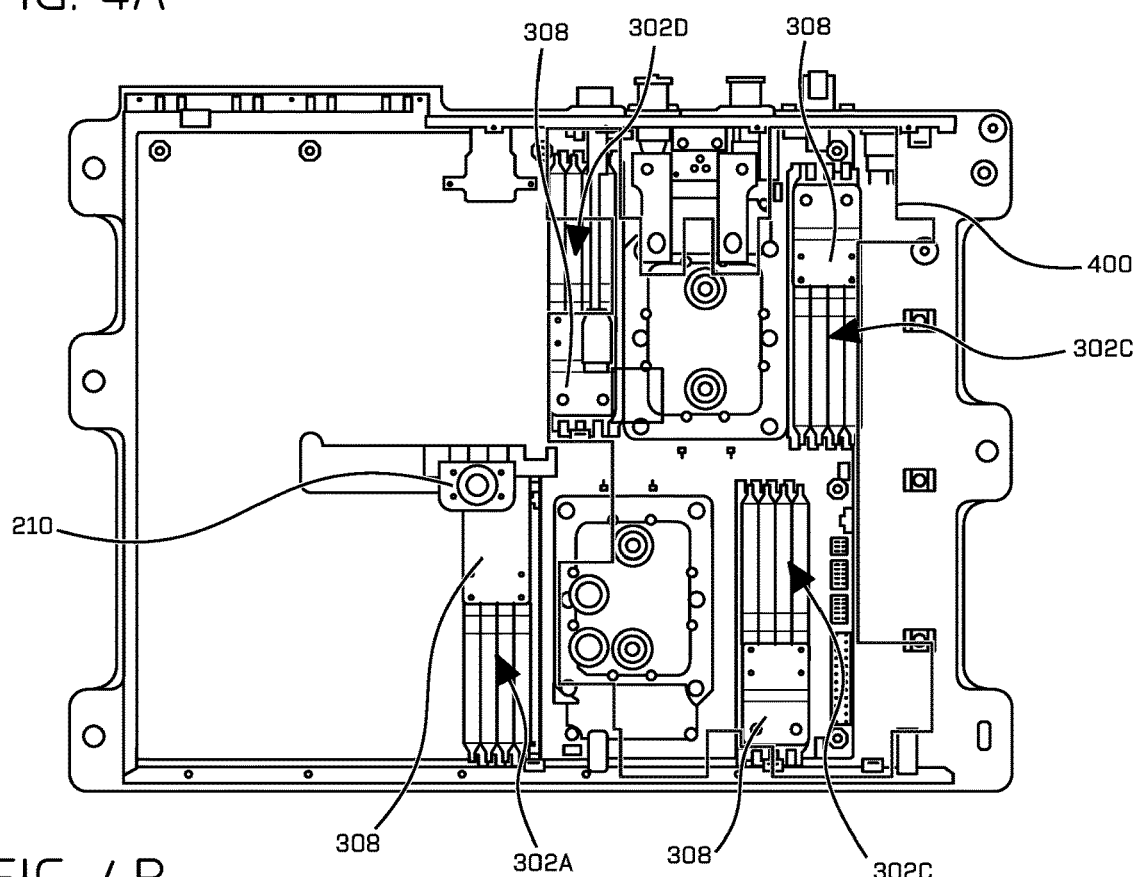
FIG. 4B is a top view of the thermal management system of FIG. 3, with the cooling block depicted.

FIGS. 4A and 4B show top views of the portion of the thermal management system 300 shown in FIG. 3. As described above, the first modular heatsink assembly 302A is coupled to the secondary manifold 210. The second through fourth modular heatsink assemblies 302B, 302C, 302D are coupled to a cooling block 400 positioned above the modular heatsink assemblies, as shown in FIG. 4B. In the depicted example, the second through forth modular heatsink assemblies 302B, 302C, 302D are each coupled to the same cooling block 400. In other examples the modular heatsink assemblies 302 can be coupled to a plurality of cooling blocks. In some examples, the cooling block 400 is a standard shape such as a rectangle. In other examples, the cooling block 400 has a custom shape such that it is accessible by each modular heatsink assembly in the thermal management system.

Figure 5A:
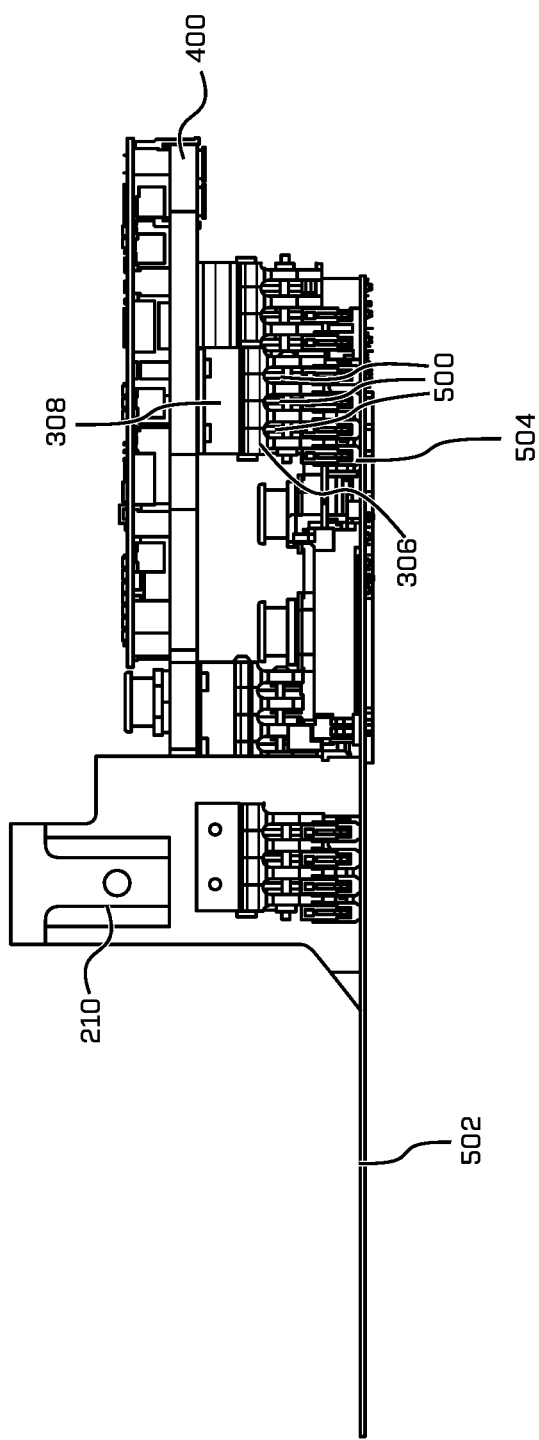
FIG. 5A is a front view of the thermal management system of FIG. 3.
Figure 5B:
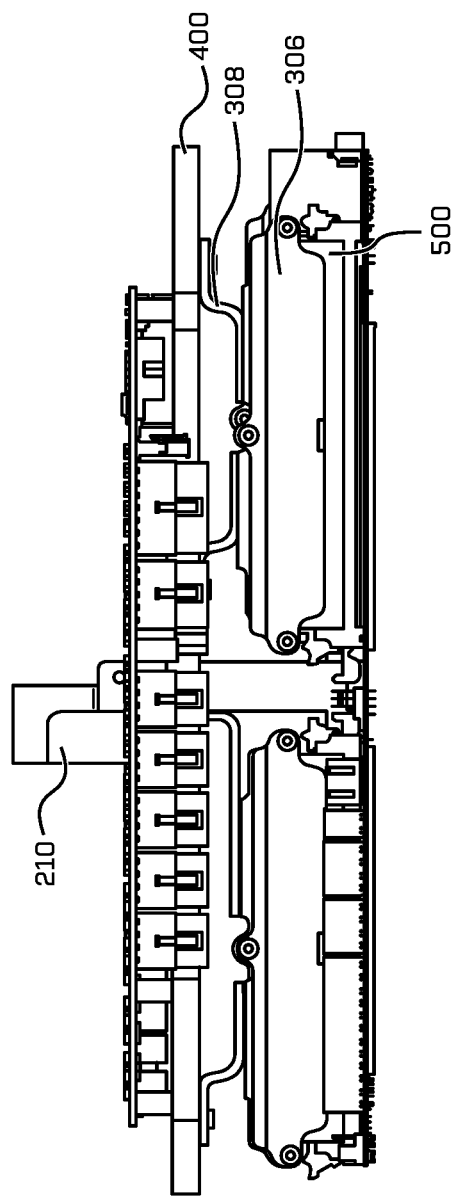
FIG. 5B is a right-side view of the thermal management system of FIG. 3.

FIGS. 5A and 5B show a front and side view respectively of the portion of the thermal management system 300 shown in FIG. 3. FIG. 5A depicts the integrated circuits 500 of the component 304 of the computer system. The integrated circuits can be daughtercards or a circuit board that plugs into and extends the circuitry of another circuit board. In the depicted examples, the integrated circuits 500 connect to a slot in the motherboard 502 or other larger circuit of the computer system such that the integrated circuits extend outwards from the motherboard. The computer system may include brackets 504 to help hold the integrated circuits 500 in communication with the motherboard 502. The modular heatsink assembly 302 is configured such that a heat spreader 306 is positioned on each side of each integrated circuit 500. In other words, each integrated circuit 500 is sandwiched between two heat spreaders 306. In some examples, the modular heatsink assembly 302 covers the top of the integrated circuits 500 of the component 304. In some examples, the integrated circuit 500 is positioned in between the top of the panels 306 and the motherboard 502. In other examples, the modular heatsink assembly 302 does not fully cover the top of the integrated circuits 500.

Figures 6A, 6B:
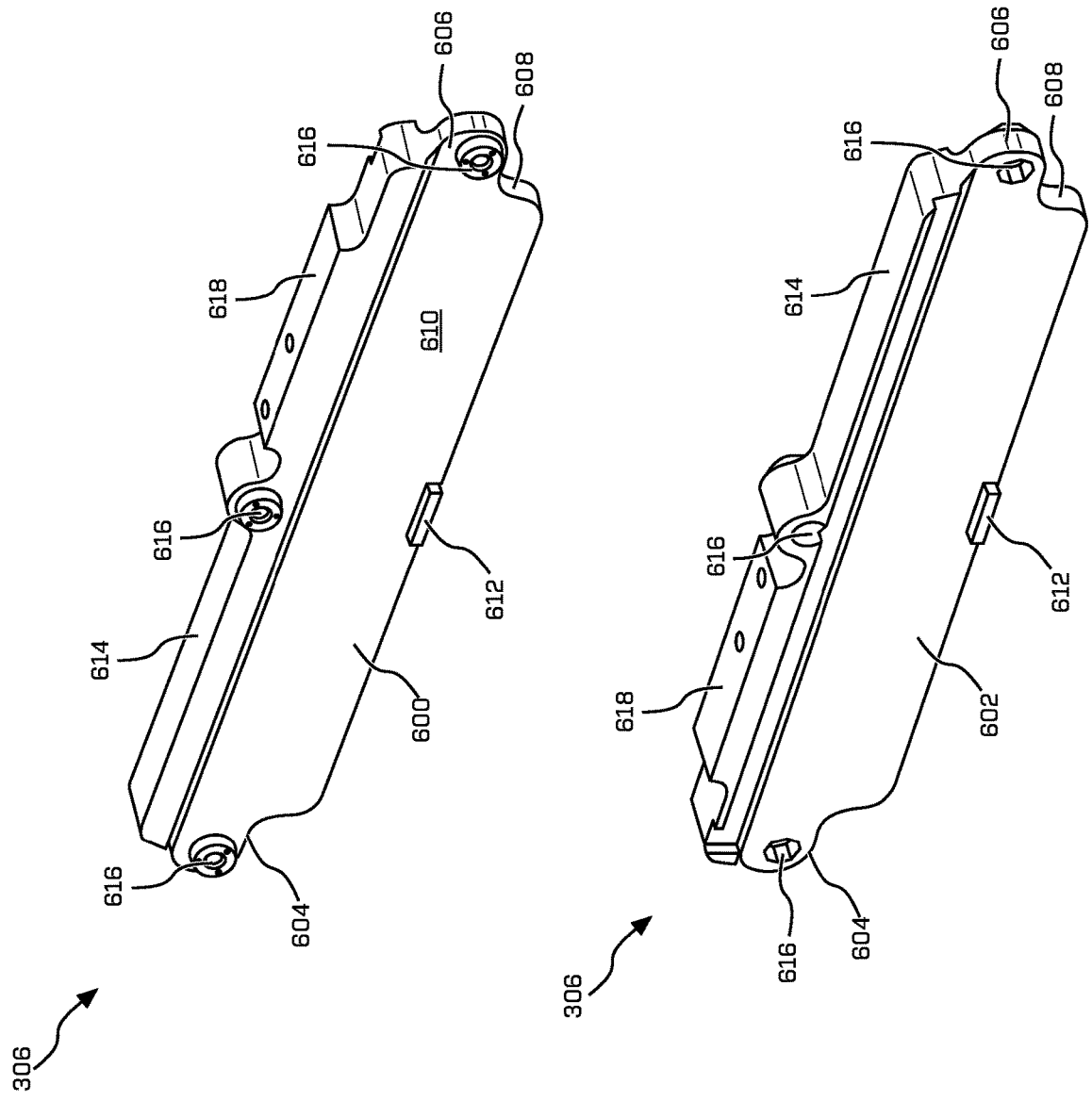
FIGS. 6A and 6B are perspective side views of opposite sides of an example heatsink element of a modular heatsink assembly.

FIGS. 6A and 6B are perspective side views of an example heat spreader 306. The heat spreader 306 can have a generally rectangular a first side 600, a second side 602, a first end 604 and a second end 606. In some examples, the heat spreader 306 can include notches and/or groves 608 to accommodate the component to which it will be applied. The heat spreader 306 includes a plate portion 610 having a substantially planar surface on the first side 600 and second side 602 of the heat spreader. The plate portion 610 can be configured to fit in between the integrated circuits of a component. In some examples, the plate portion 610 can include a positioning notch 612 on one or both sides 600, 602 of the heat spreader 306. In these examples, the positioning notch 612 is configured to contact the integrated circuit positioned on that side of the heat spreader to position the integrated circuit an appropriate distance from the remainder of the plate portion of the heat spreader.

The heat spreader 306 can also include a lip portion 614 that is wider than the plate portion 610. In the depicted example, the lip portion 614 is positioned above the top edge of the plate portion 610. In other examples, the lip portion 614 can be positioned below or to the sides edges of the plate portion 610. The lip portion 614 can also be positioned on a combination of sides of the plate portion 610. In the depicted example, the lip portion 614 extends beyond the planar surface of the plate portion 610 on both the first side 600 and second side 602 of the heat spreader 306. In other examples, the lip portion 614 can extend past the planar surface of the plate portion 610 on only one side of the heat spreader 306. In these examples, the heat spreader 306 would have a first side with a substantially planar surface and a second side with a lip overhanging the plate portion.

The heat spreader 306 can include at least one connection point 616 to accommodate a fastener to couple one or more heat spreaders together to form the modular heatsink assembly. FIGS. 6A and B depict a heat spreader with three connection points 616. In other examples, the heat spreader can have more or fewer connection points. In the depicted example, the connection points 616 are apertures configured to receive a screw or bolt. In some examples, the aperture 616 can include a swage nut or another self-tightening apparatus to assist in coupling the heat spreaders together. In the depicted example, the connection points 616 are positioned at the ends 604, 606 and top of the heat spreader 306. In other examples, the connection points can be positioned anywhere on the heat spreader that will not be blocked by the integrated circuit as shown in FIG. 7B.

The lip portion 614 of the heat spreader 306 can include a flat connector portion 618 on the top of the heat spreader. The connector portion 618 is configured to couple with a heat strap or other structure for thermally coupling the heat spreader to the cooling system.

Figure 7A:
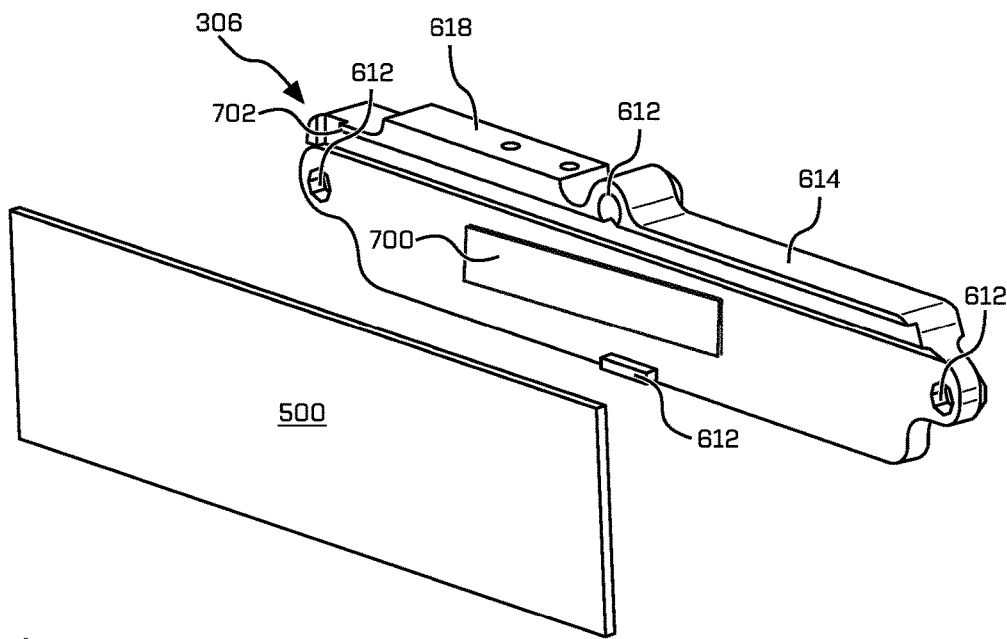
FIG. 7A is a perspective exploded view of an example heatsink element and integrated circuit of a modular heatsink assembly.
Figure 7B:
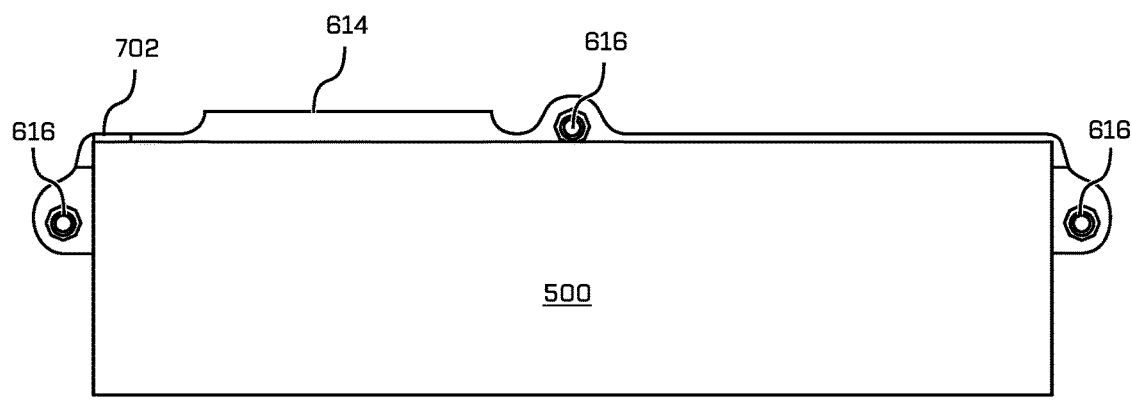
FIG. 7B is a side view of an example heatsink element and integrated circuit of a modular heatsink assembly.

FIGS. 7A and 7B show how an integrated circuit 500 of a component fits against the plate portion 610 of an example heat spreader. As shown, the heat spreader 306 can be shaped such that integrated circuit 500 fits against the plate portion 610 and under the lip portion 614 of the heat spreader. As described above, the heat spreader 306 can include a positioning notch 612 that directly contacts the integrated circuit 500. The heat spreader 306 can be sized such that the connection points 616 are not blocked by the integrated circuit 500 when it is positioned against the plate portion 610 of the heat spreader. In the depicted example, the integrated circuit 500 is depicted in these figures as rectangular and generally flat. In other examples, the integrated circuit has a different shape. The heat spreader can be sized and shaped to accommodate and sized or shaped integrated circuit or other computer component that is protected by the modular heatsink assembly.

The heat spreader 306 can additional positioning features on the lip portion 614 of the panel. In some examples, the lip portion 614 can include a bezel 702 extending outward from the lip portion. The bezel 702 can be positioned along the length of the lip portion 614. In other examples, the bezel 702 can be positioned along only a portion of the length of the lip portion 716. For example, the bezel 702 can be positioned at one or both ends of the lip portion 614. As shown in FIG. 7B, the bezel 702 can abut the top of the integrated circuit 500 to correctly position the integrated circuit relative to the heat spreader panel 306. In some examples, the heat spreader panel 306 is symmetrical along a plane parallel to the planar side of the panel. In other examples, the panel 306 includes features on only one side 600, 602 of the panel such as the bezel shown in FIG. 7B.

Figure 8A:
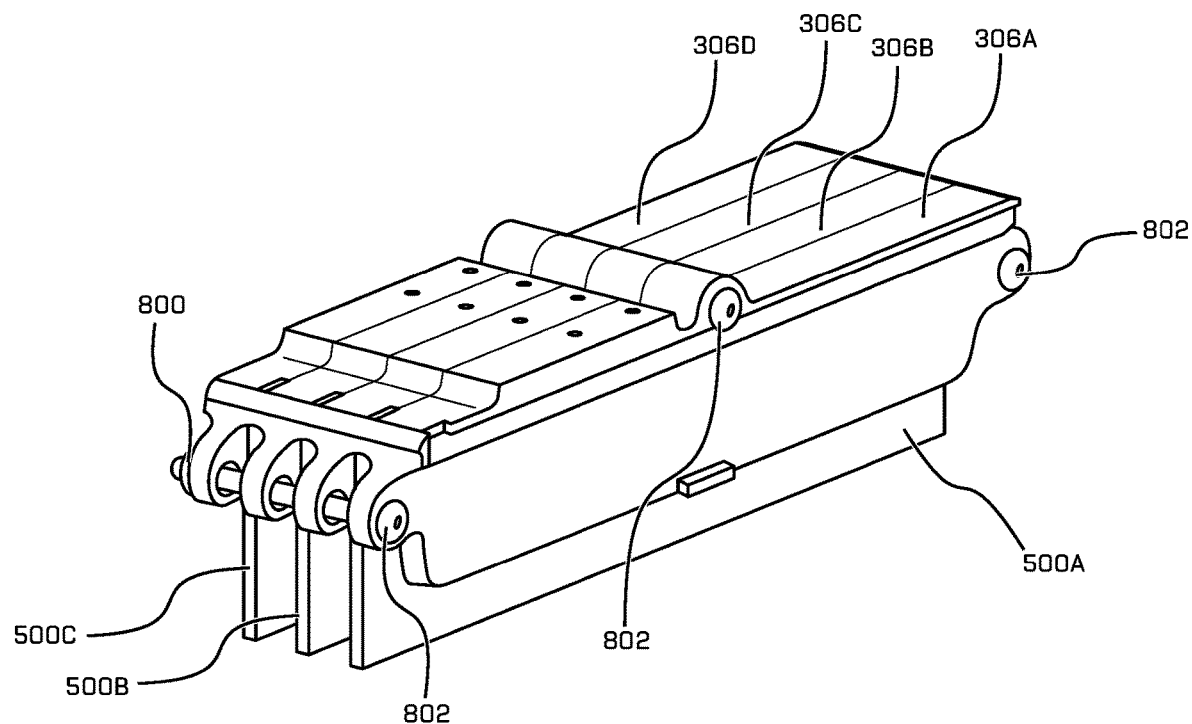
FIG. 8A is a perspective view of an example modular heatsink assembly.

FIG. 8A shows the heat spreaders 306 and integrated circuits 500 of a modular heatsink assembly 302. The heat spreaders 306 are assembled such that the lip portion 614 of one heat spreader 306A abuts the lip portion of the adjacent heat spreader 306B with the integrated circuit 500 sandwiched between the planar portions 610 of the heat spreaders 306A, 306B. So, for example, the first integrated circuit 500A has the plate portion of the first heat spreader 306A positioned adjacent to its first side and the plate portion of the second heat spreader 306B on its second side, opposite the first side. The second integrated circuit 500B has the plate portion of the second heat spreader 306B positioned on its first side and the plate portion of the third heat spreader 306C positioned on its second side opposite the first side. The third integrated circuit 500C is similarly positioned with respect to the third 306C and forth heat spreaders 306D. The modular heatsink assembly can include as many heat spreaders as necessary to accommodate the number of integrated circuits in the component.

Figure 8B:
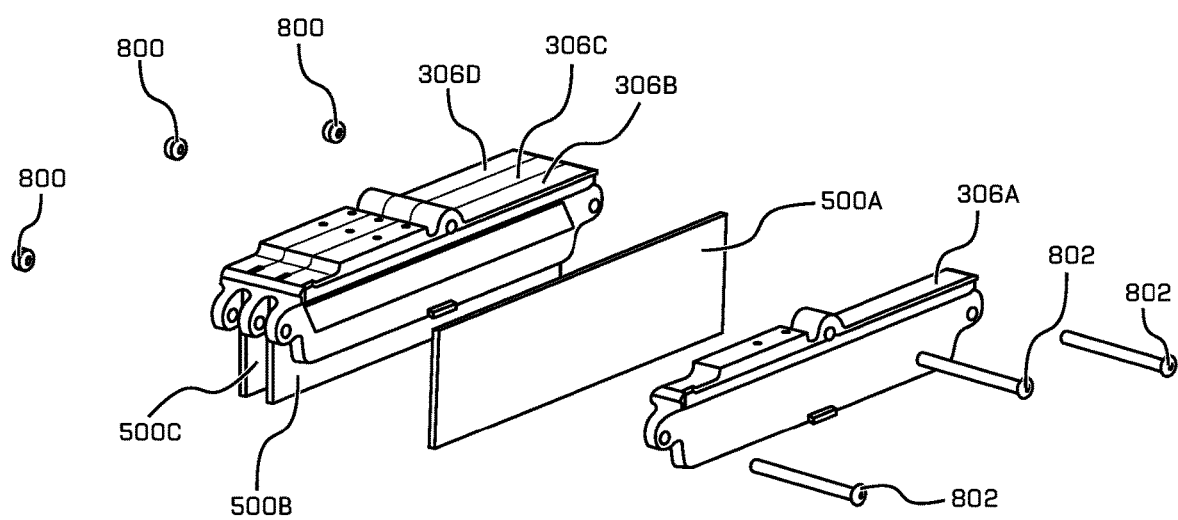
FIG. 8B is a partially exploded view of the modular heatsink assembly of FIG. 8A.

FIG. 8B shows an exploded view of the heat spreaders 306 and integrated circuits of FIG. 8A. In the depicted example, the integrated circuits 500 are positioned between the heat spreaders 306 and the heat spreaders 306 are coupled together using a fastening device such as a nut 800 and bolt 802. The bolt 802 or elongated member fits through the connection points 616 or apertures in the heat spreader 306. In this example, the bolt 802 is inserted though the apertures 616 in the first heat spreader 306A and extends through the apertures in each respective heat spreader 306B, 306C, 306D. In some examples, the connection point 616 may include a threaded portion. The bolt 802 can also include a threaded portion to accommodate the threaded portion of the connection point 616. The nut 800 attaches to the bolt 802 at a point beyond the last heat spreader 306D. In other examples, the heat spreaders 306 can be coupled together by any other fastening means including clips, snaps, and other known fasteners. In other examples, the heat spreaders 306 are each attached to a sufficiently rigid structure such as a heat strap, portion of the cooling system, or computer housing, that the heat spreaders abut on another but are not directly coupled together.

The heat spreaders 306 are sized such that a sufficient surface area of the plate portion is in thermal contact with the integrated circuit 500. In some examples, the surface area of the plate portion of the heat spreader 306 is at least 50% of the surface area of the side of the integrated circuit 500 that it is positioned beside. In other examples, the surface area of the plate portion of the heat spreader 306 is at least 60% of the surface area of the side of the integrated circuit. 500. In other examples, the surface area of the plate portion of the heat spreader 306 is at least 75% of the surface area of the side of the integrated circuit. 500.

In some examples, there is a small gap between the plate portion of the heat spreader in the integrated circuit. In other examples, a thermal interface material 700 is positioned in the gap between the plate portion 610 of the heat spreader and the integrated circuit 500. Example thermal interface materials include a thermally conductive pad, thermal grease, heat tape or dispensable jelly. The thermal interface material can also protect the integrated circuit or other computer component from damage caused by vibrations of the vehicle. The thermal interface material can dampen vibrations caused by operation of the vehicle. In some examples, a pad or substance can be inserted into the gap that does not have thermally conductive properties.

The structure depicted in FIGS. 8A and B has been described above as portion of a modular heatsink assembly. But, in some examples, the same structure can be formed from materials without thermally conductive properties can be coupled with a component of a vehicle computing system to provide rigidity and protection to the component without thermally dissipative properties. For example, the invention can comprise a series of covers each having the same size and shape as the heat spreaders 306 described above or be heat spreaders 306 themselves. The covers can attach to one another and cover the integrated circuits in the same manner as the heat spreaders described above. The covers can be fixedly coupled to a housing enclosing the integrated circuits to protect them from the riggers of operation of the vehicle.

Figure 9A:
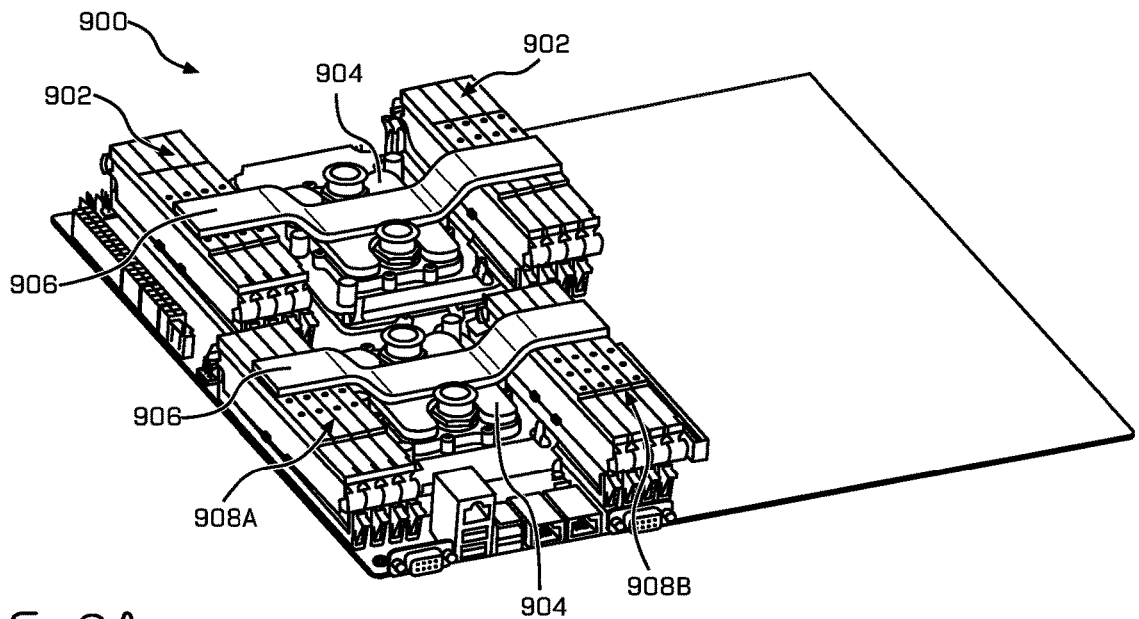
FIG. 9A is a perspective view of another example thermal management system incorporating a modular heatsink assembly.
Figure 9B:
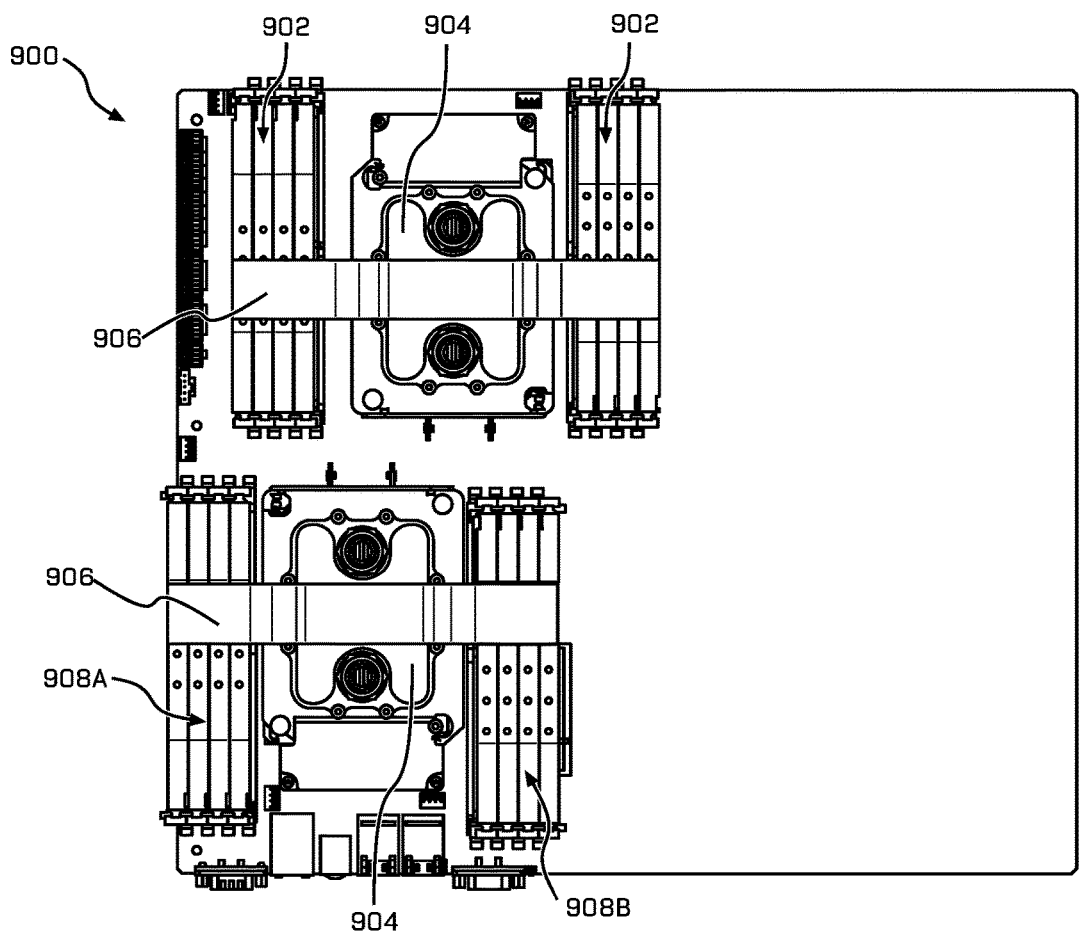
FIG. 9B is a top view of the thermal management system of FIG. 9A.
Figure 9C:
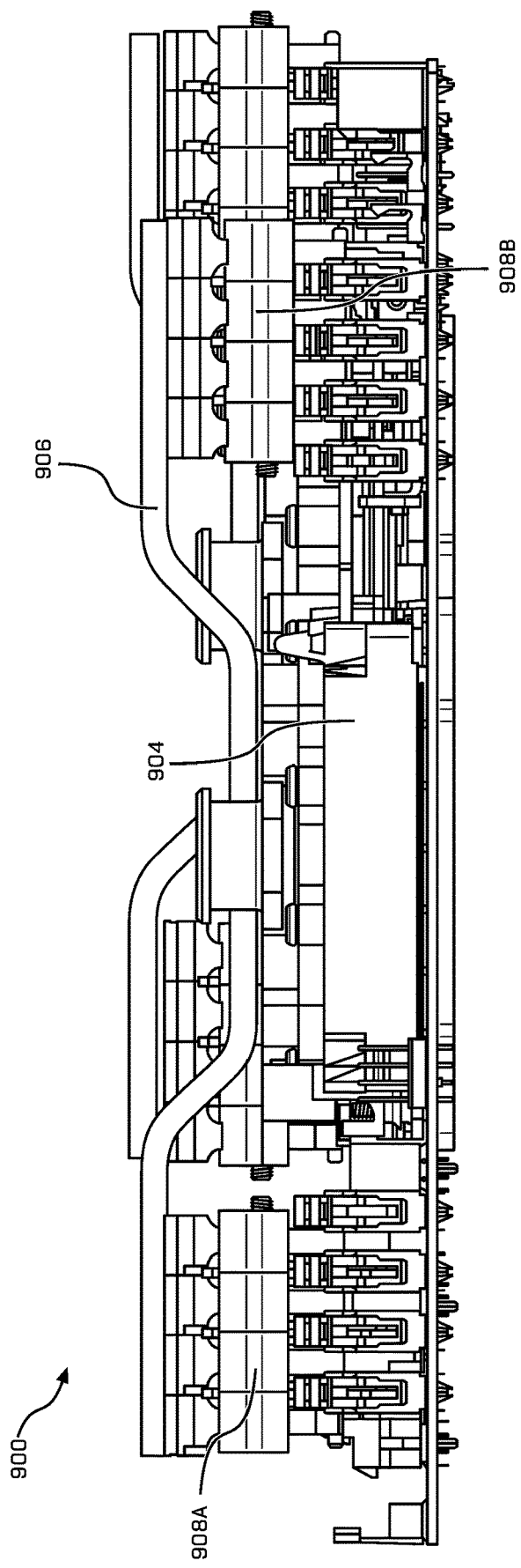
FIG. 9C is a front view of the thermal management system of FIG. 9A.

FIGS. 9A-C depicts a portion of an example thermal management system 900 having four modular heatsink assemblies 902. The modular heatsink assemblies 902 include scalable heat spreaders 306 similar to the above described examples. Each set of heat spreaders 908 can be positioned adjacent or in the vicinity of a portion of the cooling system 204 such as a cooling block 904. In the depicted example, the heat spreaders 306 are thermally coupled to a cooling block 904 using a heat strap 906. The heat strap 906 is configured to couple the cooling block 904 in the middle of the heat strap 906, a first set of heat spreaders 908A at a first end of the heat strap, and a second set of heat spreaders 908B at a second end of the heat strap. In other examples, the heat strap can be coupled to another portion of the cooling system 204 other than a cooling block, for example a manifold. In other examples, the heat strap can couple to only one set of heat spreaders 908 and a portion of the cooling system 204. In other examples, a single heat strap 906 can couple three or more sets of heat spreaders 908 to a portion of the cooling system 204. In some examples, the heat strap 906 is rigid such that it helps hold the set of heat spreaders 908 in place to help protect the integrated circuits of the computer component during operation of the vehicle.

Figure 10:
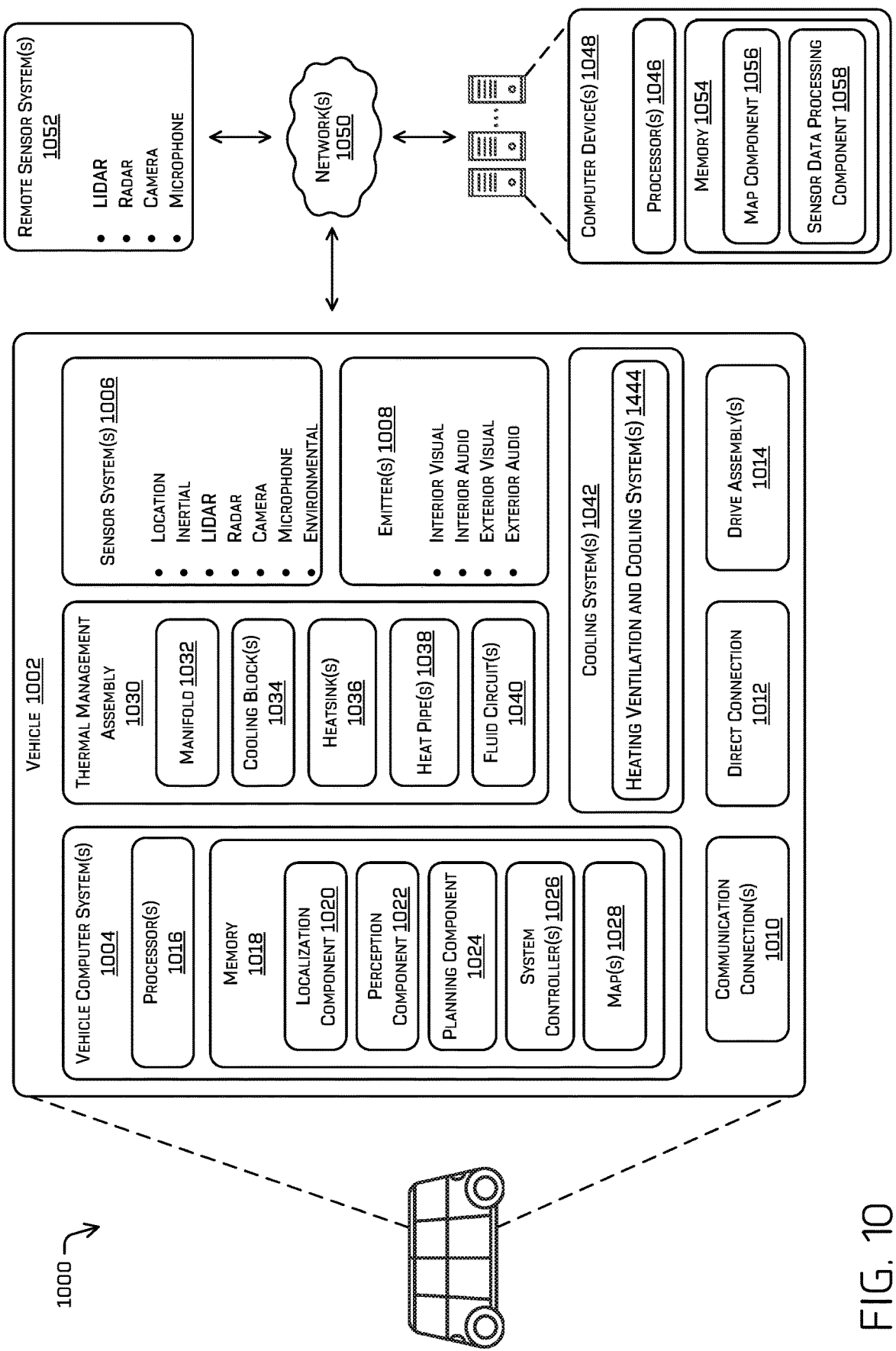
FIG. 10 is a block diagram of an example system in which the example thermal management systems and modular heatsink assemblies described herein can be implemented.

FIG. 10 is a block diagram of an example system 1000 for implementing the techniques described herein. In at least one example, the system 1000 may include a vehicle, such as vehicle 1002. The vehicle 1002 may include a vehicle computer system 1004, one or more sensor systems 1006, one or more emitters 1008, one or more communication connections 1010, at least one direct connection 1012, and one or more drive assemblies 1014.

The vehicle computer system 1004 may include one or more processors 1016 and memory 1018 communicatively coupled with the one or more processors 1016. In the illustrated example, the vehicle 1002 is an autonomous vehicle; however, the vehicle 1002 could be any other type of vehicle, such as a semi-autonomous vehicle, or any other system having at least an image capture device (e.g., a camera enabled smartphone). In the illustrated example, the memory 1018 of the vehicle computer system 1004 stores a localization component 1020, a perception component 1022, a planning component 1024, one or more system controllers 1026, and one or more maps 1028. Though depicted in FIG. 10 as residing in the memory 1018 for illustrative purposes, it is contemplated that the localization component 1020, a perception component 1022, a planning component 1024, one or more system controllers 1026, and/or one or more maps 1028 additionally, or alternatively, be accessible to the vehicle 1002 (e.g., stored on, or otherwise accessible by, memory remote from the vehicle 1002, such as, for example, on memory 1054 of a remote computer device 1048). In some examples, multiple vehicle computer systems may be included on the vehicle 1002 and may be cooled using the thermal techniques described herein.

In at least one example, the localization component 1020 may include functionality to receive data from the sensor system(s) 1006 to determine a position and/or orientation of the vehicle 1002 (e.g., one or more of an x-, y-, z-position, roll, pitch, or yaw). For example, the localization component 1020 may include and/or request/receive a map of an environment, such as from map(s) 1028 and/or map component 1056 and may continuously determine a location and/or orientation of the autonomous vehicle within the map. In some instances, the localization component 1020 may utilize SLAM (simultaneous localization and mapping), CLAMS (calibration, localization and mapping, simultaneously), relative SLAM, bundle adjustment, non-linear least squares optimization, or the like to receive image data, lidar data, radar data, IMU data, GPS data, wheel encoder data, and the like to accurately determine a location of the autonomous vehicle. In some instances, the localization component 1020 may provide data to various components of the vehicle 1002 to determine an initial position of an autonomous vehicle for determining the relevance of an object to the vehicle 1002, as discussed herein.

In some instances, the perception component 1022 may include functionality to perform object detection, segmentation, and/or classification. In some examples, the perception component 1022 may provide processed sensor data that indicates a presence of an object (e.g., entity) that is proximate to the vehicle 1002 and/or a classification of the object as an object type (e.g., car, pedestrian, cyclist, animal, building, tree, road surface, curb, sidewalk, unknown, etc.). In some examples, the perception component 1022 may provide processed sensor data that indicates a presence of a stationary entity that is proximate to the vehicle 1002 and/or a classification of the stationary entity as a type (e.g., building, tree, road surface, curb, sidewalk, unknown, etc.). In additional or alternative examples, the perception component 1022 may provide processed sensor data that indicates one or more features associated with a detected object (e.g., a tracked object) and/or the environment in which the object is positioned. In some examples, features associated with an object may include, but are not limited to, an x-position (global and/or local position), a y-position (global and/or local position), a z-position (global and/or local position), an orientation (e.g., a roll, pitch, yaw), an object type (e.g., a classification), a velocity of the object, an acceleration of the object, an extent of the object (size), etc. Features associated with the environment may include, but are not limited to, a presence of another object in the environment, a state of another object in the environment, a time of day, a day of a week, a season, a weather condition, an indication of darkness/light, etc.

In general, the planning component 1024 may determine a path for the vehicle 1002 to follow to traverse through an environment. For example, the planning component 1024 may determine various routes and trajectories and various levels of detail. For example, the planning component 1024 may determine a route to travel from a first location (e.g., a current location) to a second location (e.g., a target location). For the purpose of this discussion, a route may include a sequence of waypoints for travelling between two locations. As non-limiting examples, waypoints include streets, intersections, global positioning system (GPS) coordinates, etc. Further, the planning component 1024 may generate an instruction for guiding the autonomous vehicle along at least a portion of the route from the first location to the second location. In at least one example, the planning component 1024 may determine how to guide the autonomous vehicle from a first waypoint in the sequence of waypoints to a second waypoint in the sequence of waypoints. In some examples, the instruction may be a trajectory, or a portion of a trajectory. In some examples, multiple trajectories may be substantially simultaneously generated (e.g., within technical tolerances) in accordance with a receding horizon technique, wherein one of the multiple trajectories is selected for the vehicle 1002 to navigate.

In some examples, the planning component 1024 may include a prediction component to generate predicted trajectories of objects (e.g., objects) in an environment. For example, a prediction component may generate one or more predicted trajectories for objects within a threshold distance from the vehicle 1002. In some examples, a prediction component may measure a trace of an object and generate a trajectory for the object based on observed and predicted behavior.

In at least one example, the vehicle computer system 1004 may include one or more system controllers 1026, which may be configured to control steering, propulsion, braking, safety, emitters, communication, and other systems of the vehicle 1002. The system controller(s) 1026 may communicate with and/or control corresponding systems of the drive assembly(s) 1014 and/or other components of the vehicle 1002.

The memory 1018 may further include one or more maps 1028 that may be used by the vehicle 1002 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map may include, but is not limited to: texture information (e.g., color information (e.g., RGB color information, Lab color information, HSV/HSL color information), and the like), intensity information (e.g., lidar information, radar information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map may include a three-dimensional mesh of the environment. In some examples, the vehicle 1002 may be controlled based at least in part on the map(s) 1028. That is, the map(s) 1028 may be used in connection with the localization component 1020, the perception component 1022, and/or the planning component 1024 to determine a location of the vehicle 1002, detect objects in an environment, generate routes, determine actions and/or trajectories to navigate within an environment.

In some examples, the one or more maps 1028 may be stored on a remote computing device(s) (such as the computer device(s) 1048) accessible via network(s) 1050. In some examples, multiple maps 1028 may be stored based on, for example, a characteristic (e.g., type of entity, time of day, day of week, season of the year, etc.). Storing multiple maps 1028 may have similar memory requirements but increase the speed at which data in a map may be accessed.

FIG. 10 also illustrates the vehicle 1002 including a thermal management system 1030 that includes a manifold 1032, cooling block(s) 1034, heatsink(s) 1036, heat pipe(s) 1038, and fluid circuit(s) 1040. The vehicle 1002 is also shown to include cooling system(s) 1042 that includes heating ventilation and cooling system(s) 1044. In some examples, the heating ventilation and cooling system(s) 1044 may comprise an evaporator(s), a condenser(s), a compressor(s), and/or a chiller(s). In some examples, the cooling system 1042 is coupled to and/or in fluid communication with the thermal management system 1030 to cool the vehicle computer system 1004. In various examples, the thermal management system 1030 may be in thermal communication and/or fluid communication with two cooling systems 1042 (e.g., with each cooling system 1042 located in different drive assemblies 1014.

In various examples, the thermal management system 1030 may supply fluid between the cooling system 1042 and the manifold 1032. The manifold 1032 may correspond to the primary manifold 208, the secondary manifold 210, or a combination of the primary manifold 208 and the secondary manifold 210. For instance, the manifold 1032 may be configured to transfer fluid to direct fluid (e.g., a liquid, a gas, or a combination of liquid and gas) to one or more cooling blocks 1034 to cool different components of the vehicle computer system 1004. In some examples, the manifold 1032 may direct fluid from the cooling system 1042 to multiple cooling blocks 1034 in parallel to supply fluid at a first temperature to each of the multiple cooling blocks 1034 at substantially the same time and without first passing through another of the multiple cooling blocks 1034. The manifold 1032 may also or instead be configured to direct fluid from the multiple cooling blocks 1034 to the cooling system 1042 to cool the fluid.

In some examples, the cooling block(s) 1034 may be associated with different components of the vehicle computer system 1004 such as the one or more processor(s) 1016, the localization component 1020, the perception component 1022, the planning component 1024, the one or more system controllers 1026, and the one or more maps 1028. Additionally, or in the alternative, the cooling block(s) 1034 may be associated with a graphics processing unit, a central processing unit, a voltage regulator, an ethernet controller, a chipset, a solid-state drive, a power supply, a memory device, an image processing unit, and/or a network interface card of the vehicle computer system 1004.

In some examples, the heatsink 1036 may be between the manifold 1032 and a component of the vehicle computer system 1004 to provide thermal cooling to the component of the vehicle computer system 1004. Here, the heatsink 1036 in contact with a portion of the component draws heat from the component to the manifold 1032. The heatsink 1036 can be configured in a variety of shapes and sizes to extend from the manifold 1032 to a component of the computer system that generates heat. In some examples, the heatsink 1036 is a modular heatsink assembly like the examples shown in FIGS. 3-8B. In some examples, the heatsink 1036 may comprise metals such as aluminum, magnesium, copper, etc. and/or crystal structures such as graphite, graphene, and so on. In some examples, the heatsink 1036 may be configured to extend from a portion of the cooling block 1034 and/or the manifold 1032 to a component of the vehicle computer system 1004.

In some examples, the fluid circuit(s) 1040 may be used to transfer fluid among the cooling system 1042, the manifold 1032, and/or the cooling blocks 1034. In some examples a first fluid circuit may be associated with a first cooling system and a second fluid circuit may be associated with a second cooling system.

As can be understood, the components discussed herein (e.g., the localization component 1020, the perception component 1022, the planning component 1024, the one or more system controllers 1026, the one or more maps 1028, are described as divided for illustrative purposes. However, the operations performed by the various components may be combined or performed in any other component of the vehicle computer system 1004.

In some instances, aspects of some or all of the components discussed herein may include any models, techniques, and/or machine learned techniques. For example, in some instances, the components in the memory 1018 (and the memory 1054, discussed below) may be implemented as a neural network.

As described herein, an exemplary neural network is a biologically inspired technique which passes input data through a series of connected layers to produce an output. Each layer in a neural network may also comprise another neural network, or may comprise any number of layers (whether convolutional or not). As can be understood in the context of this disclosure, a neural network may utilize machine learning, which may refer to a broad class of such techniques in which an output is generated based on learned parameters.

Although discussed in the context of neural networks, any type of machine learning may be used consistent with this disclosure. For example, machine learning techniques may include, but are not limited to, regression techniques (e.g., ordinary least squares regression (OLSR), linear regression, logistic regression, stepwise regression, multivariate adaptive regression splines (MARS), locally estimated scatterplot smoothing (LOESS)), instance-based techniques (e.g., ridge regression, least absolute shrinkage and selection operator (LASSO), elastic net, least-angle regression (LARS)), decisions tree techniques (e.g., classification and regression tree (CART), iterative dichotomiser 3 (ID3), Chi-squared automatic interaction detection (CHAID), decision stump, conditional decision trees), Bayesian techniques (e.g., naïve Bayes, Gaussian naïve Bayes, multinomial naïve Bayes, average one-dependence estimators (AODE), Bayesian belief network (BNN), Bayesian networks), clustering techniques (e.g., k-means, k-medians, expectation maximization (EM), hierarchical clustering), association rule learning techniques (e.g., perceptron, back-propagation, hopfield network, Radial Basis Function Network (RBFN)), deep learning techniques (e.g., Deep Boltzmann Machine (DBM), Deep Belief Networks (DBN), Convolutional Neural Network (CNN), Stacked Auto-Encoders), Dimensionality Reduction Techniques (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Techniques (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet70, ResNet101, VGG, DenseNet, PointNet, and the like.

In at least one example, the sensor system(s) 1006 may include lidar sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 1006 may include multiple instances of each of these or other types of sensors. For instance, the lidar sensors may include individual lidar sensors located at the corners, front, back, sides, and/or top of the vehicle 1002. As another example, the camera sensors may include multiple cameras disposed at various locations about the exterior and/or interior of the vehicle 1002. The sensor system(s) 1006 may provide input to the vehicle computer system 1004. Additionally, or in the alternative, the sensor system(s) 1006 may send sensor data, via the one or more networks 1050, to the one or more computing device(s) 1048 at a particular frequency, after a lapse of a predetermined period of time, in near real-time, etc.

The vehicle 1002 may also include one or more emitters 1008 for emitting light and/or sound. The emitters 1008 may include interior audio and visual emitters to communicate with passengers of the vehicle 1002. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 1008 may also include exterior emitters. By way of example and not limitation, the exterior emitters may include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 1002 may also include one or more communication connections 1010 that enable communication between the vehicle 1002 and one or more other local or remote computing device(s). For instance, the communication connection(s) 1010 may facilitate communication with other local computing device(s) on the vehicle 1002 and/or the drive assembly(s) 1014. Also, the communication connection(s) 1010 may allow the vehicle to communicate with other nearby computing device(s) (e.g., remote computing device 1048, other nearby vehicles, etc.) and/or one or more remote sensor system(s) 1052 for receiving sensor data. The communications connection(s) 1010 also enable the vehicle 1002 to communicate with a remote teleoperations computing device or other remote services.

The communications connection(s) 1010 may include physical and/or logical interfaces for connecting the vehicle computer system 1004 to another computing device or a network, such as network(s) 1050. For example, the communications connection(s) 1010 can enable Wi-Fi-based communication such as via frequencies defined by the IEEE 1402.11 standards, short range wireless frequencies such as Bluetooth, cellular communication (e.g., 2G, 3G, 4G, 4G LTE, 5G, etc.) or any suitable wired or wireless communications protocol that enables the respective computing device to interface with the other computing device(s).

In at least one example, the vehicle 1002 may include one or more drive assembly(s) 1414. In some examples, the vehicle 1002 may have a single drive assembly 1014. In at least one example, if the vehicle 1002 has multiple drive assemblies 1014, individual drive assemblies 1014 may be positioned on opposite ends of the vehicle 1002 (e.g., the front and the rear, etc.). In at least one example, the drive assembly(s) 1414 may include one or more sensor systems to detect conditions of the drive assembly(s) 1014 and/or the surroundings of the vehicle 1002. By way of example and not limitation, the sensor system(s) may include one or more wheel encoders (e.g., rotary encoders) to sense rotation of the wheels of the drive assemblies, inertial sensors (e.g., inertial measurement units, accelerometers, gyroscopes, magnetometers, etc.) to measure orientation and acceleration of the drive assembly, cameras or other image sensors, ultrasonic sensors to acoustically detect objects in the surroundings of the drive assembly, lidar sensors, radar sensors, etc. Some sensors, such as the wheel encoders may be unique to the drive assembly(s) 1014. In some cases, the sensor system(s) on the drive assembly(s) 1414 may overlap or supplement corresponding systems of the vehicle 1002 (e.g., sensor system(s) 1006).

The drive assembly(s) 1014 may include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, a heating ventilation and cooling (HVAC) system (e.g., the HVAC system 1044), lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive assembly(s) 1014 may include a drive assembly controller which may receive and preprocess data from the sensor system(s) and to control operation of the various vehicle systems. In some examples, the drive assembly controller may include one or more processors and memory communicatively coupled with the one or more processors. The memory may store one or more modules to perform various functionalities of the drive assembly(s) 1014. Furthermore, the drive assembly(s) 1014 may also include one or more communication connection(s) that enable communication by the respective drive assembly with one or more other local or remote computing device(s).

In at least one example, the direct connection 1012 may provide a physical interface to couple the one or more drive assembly(s) 1014 with the body of the vehicle 1002. For example, the direct connection 1012 may allow the transfer of energy, fluids, air, data, etc. between the drive assembly(s) 1014 and the vehicle. In some instances, the direct connection 1012 may further releasably secure the drive assembly(s) 1014 to the body of the vehicle 1002.

In at least one example, the localization component 1020, the perception component 1022, the planning component 1024, the one or more system controllers 1026, and the one or more maps 1028 may process sensor data, as described above, and may send their respective outputs, over the one or more network(s) 1050, to the computing device(s) 1048. In at least one example, the localization component 1020, the perception component 1022, the planning component 1024, the one or more system controllers 1026, and the one or more maps 1028 may send their respective outputs to the remote computing device(s) 1048 at a particular frequency, after a lapse of a predetermined period of time, in near real-time, etc.

In some examples, the vehicle 1002 may send sensor data to the computing device(s) 1048 via the network(s) 1050. In some examples, the vehicle 1002 may receive sensor data from the computing device(s) 1048 and/or remote sensor system(s) 1052 via the network(s) 1050. The sensor data may include raw sensor data and/or processed sensor data and/or representations of sensor data. In some examples, the sensor data (raw or processed) may be sent and/or received as one or more log files.

The computing device(s) 1048 may include processor(s) 1046 and a memory 1054 storing the map component 1056 and a sensor data processing component 1058. In some examples, the map component 1056 may include functionality to generate maps of various resolutions. In such examples, the map component 1056 may send one or more maps to the vehicle computer system 1004 for navigational purposes. In various examples, the sensor data processing component 1058 may be configured to receive data from one or more remote sensors, such as sensor system(s) 1006 and/or remote sensor system(s) 1052. In some examples, the sensor data processing component 1058 may be configured to process the data and send processed sensor data to the vehicle computer system 1004. In some examples, the sensor data processing component 1058 may be configured to send raw sensor data to the vehicle computer system 1004.

The processor(s) 1016 of the vehicle 1002 and the processor(s) 1046 of the computing device(s) 1048 may be any suitable processor capable of executing instructions to process data and perform operations as described herein. By way of example and not limitation, the processor(s) 1016 and 1046 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

Memory 1018 and memory 1054 are examples of non-transitory computer-readable media. The memory 1018 and memory 1054 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 1018 and memory 1054 may include at least a working memory and a storage memory. For example, the working memory may be a high-speed memory of limited capacity (e.g., cache memory) that is used for storing data to be operated on by the processor(s) 1016 and 1046. In some instances, the memory 1018 and memory 1054 may include a storage memory that may be a lower-speed memory of relatively large capacity that is used for long-term storage of data. In some cases, the processor(s) 1016 and 1046 cannot operate directly on data that is stored in the storage memory, and data may need to be loaded into a working memory for performing operations based on the data, as discussed herein.

It should be noted that while FIG. 10 is illustrated as a distributed system, in alternative examples, components of the vehicle 1002 may be associated with the computing device(s) 1048 and/or components of the computing device(s) 1048 may be associated with the vehicle 1002. That is, the vehicle 1002 may perform one or more of the functions associated with the computing device(s) 1048, and vice versa.

EXAMPLE CLAUSES

Any of the example clauses in this section may be used with any other of the example clauses and/or any of the other examples or embodiments described herein.

A: In some examples, a vehicle comprising: a computer system comprising a first computer component and a second computer component; a thermal dissipation component; and a thermal management system comprising: a cooling component in fluid communication with the thermal dissipation component; a first panel coupled to a first side of the first computing component; a second panel coupled a second side of the first computing component opposite the first side of the first computing component, the second panel also coupled to a first side of the second computing component; and a third panel coupled to a second side of the second computing component opposite the first side of the second computing component, wherein the first, second, and third panels are mechanically coupled together; wherein the first, second, and third panels are thermally coupled to the cooling component.

B: The vehicle of example A, wherein the computer component comprises a substantially planar board having a rectangular shape.

C: The vehicle of examples A or B, wherein the computer component comprises a memory module.

D: The vehicle of any one of examples A-C, wherein the first, second, and third panels are of substantially identical design.

E: The vehicle of any one of examples A-D, further comprising a structure rigidly coupling to the thermal management system to the vehicle.

F: The vehicle of any one of examples A-E, wherein the first panel comprises a plate having a top and bottom, wherein the first panel comprises a lip positioned proximate the top of the plate, and wherein at least a portion of the lip abuts a portion of the second panel.

G: The vehicle of any one of examples A-F, wherein the first and second panels include integrated fluid channels such that the first and second panels are in fluid communication with each other and the thermal dissipation component when the first and second panels are mechanically coupled around the first computing component.

H: The vehicle of any one of examples A-G, wherein at least one of the first panel or second panel comprises at least one of copper, aluminum, or steel.

I: The vehicle of any one of examples A-H, further comprising a thermal interface material positioned between the first panel and the computer component.

J: In some examples, a vehicle computing device comprising: a computer component, having a first side, a second side, a bottom and a top, wherein the bottom of the computer component is configured to be coupled to a motherboard; a first panel comprising: a first side including a first substantially planar plate portion and a first lip portion protruding from the first side of the first panel along at least a portion of an edge of the first substantially planar plate portion, wherein the first substantially planar plate portion is positioned adjacent to the first side of the computer component and the first lip portion is positioned above the top of the computer component; and a second side opposite the first side, the second side including a second substantially planar plate portion and a second lip portion protruding from the second side of the first panel along at least a portion of an edge of the second substantially planar plate portion; and a second panel comprising a third substantially planar plate portion and a third lip portion protruding from a side of the second panel along at least a portion of an edge of the third plate portion, wherein the third plate portion is positioned adjacent to the second side of the computer component, wherein the first panel is coupled to the second panel.

K: The vehicle computing device of example J, further comprising a vibration dampening material disposed between the first panel and the computer component.

L: The vehicle computing device of examples J or K, wherein the first and second panels are coupled such that the first lip portion and third lip portion create a gap between the first plate portion of the first panel and the third plate portion of the second panel to accommodate the computer component.

M: The vehicle computing device of any one of examples J-L, wherein the first panel is coupled to the second panel via elongated members spaced apart to accommodate a length of a side of the computer component therebetween.

N: The vehicle computing device of any one of examples J-L, wherein the first panel provides a thermally conductive path between the computer component and a structure of the vehicle, the thermally conductive path providing a higher thermally conductivity then if the first substantially planar plate portion of the first panel was not positioned adjacent to the first side of the computer component.

O: The vehicle computing device example N, wherein the at least one of the first panel or the second panel is fixedly coupled to a structure of the vehicle.

P: The vehicle computing device of any one of examples J-O, wherein the computer component is a memory module.

Q: In some examples, a scalable heat spreader for use in a thermal management system, the heat spreader comprising: an elongated plate having a first side, a second side, a top and a bottom; a lip protruding from an edge of the first side of the plate to abut a second instance of the heat spreader, the lip configured to space the second instance of the heat spreader from the heat spreader to receive a computing component between the heat spreader and the second instance of the heat spreader; and a connecting feature for rigidly connecting the heat spreader to the second instance of the heat spreader.

R: The heat spreader of example Q, wherein the connecting feature includes a threaded portion.

S: The heat spreader of example Q or R, wherein the lip is a first lip, the heat spreader further comprising a second lip positioned on the second side of the heat spreader.

T: The heat spreader any one of examples Q-S, wherein the first side of the heat spreader is substantially symmetrical with the second side.

While the example clauses described above are described with respect to one particular implementation, it should be understood that, in the context of this document, the content of the example clauses may also be implemented via a method, device, system, a computer-readable medium, and/or another implementation.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A vehicle comprising:
    a computer system comprising a first computing component and a second computing component;
    a thermal dissipation component; and
    a thermal management system comprising:
        a cooling component in fluid communication with the thermal dissipation component;
        a first panel coupled to a first side of the first computing component;
        a second panel coupled a second side of the first computing component opposite the first side of the first computing component, the second panel also coupled to a first side of the second computing component; and
        a third panel coupled to a second side of the second computing component opposite the first side of the second computing component, wherein the first panel is mechanically coupled to the second panel such that the first panel abuts the second panel, and the second panel is mechanically coupled to the third panel such that the second panel abuts the third panel;
    wherein the first panel, the second panel, and the third panel are thermally coupled to the cooling component.

2. The vehicle of claim 1, wherein at least one of the first computing component or the second computing component comprises a substantially planar board having a rectangular shape.

3. The vehicle of claim 1, wherein at least one of the first computing component or the second computing component comprises a memory module.

4. The vehicle of claim 1, wherein the first panel, the second panel, and the third panel are of substantially identical design.

5. The vehicle of claim 1, further comprising a structure rigidly coupling the thermal management system to the vehicle.

6. The vehicle of claim 1, wherein the first panel comprises a plate having a top and bottom, wherein the first panel comprises a lip positioned proximate the top of the plate, and wherein at least a portion of the lip abuts a portion of the second panel.

7. The vehicle of claim 1, wherein the first panel and the second panel include integrated fluid channels such that the first panel and the second panel are in fluid communication with each other and the thermal dissipation component when the first panel and the second panel are mechanically coupled around the first computing component.

8. The vehicle of claim 1, wherein at least one of the first panel or the second panel comprises at least one of copper, aluminum, or steel.

9. The vehicle of claim 1, further comprising a thermal interface material positioned between the first panel and the first computing component.

10. The vehicle of claim 1, wherein the first panel comprises:
    a first side including a first substantially planar plate portion and a first lip portion protruding from the first side of the first panel along at least a portion of an edge of the first substantially planar plate portion, wherein the first substantially planar plate portion is positioned adjacent to the first side of the first computing component and the first lip portion is positioned above a top of the first computing component; and a second side opposite the first side, the second side including a second substantially planar plate portion and a second lip portion protruding from the second side of the first panel along at least a portion of an edge of the second substantially planar plate portion; and the second panel comprises a third substantially planar plate portion and a third lip portion protruding from a side of the second panel along at least a portion of an edge of the third substantially planar plate portion, wherein the third substantially planar plate portion is positioned adjacent to the second side of the first computing component, wherein the first panel is coupled to the second panel.

11. The vehicle of claim 1, wherein:

the third panel is also coupled to a first side of a third computing component; and a fourth panel is coupled to a second side of the third computing component opposite the first side of the third computing component, wherein the third panel and the fourth panel are mechanically coupled together.

12. A computing device comprising:

a first computing component and a second computing component;

a thermal dissipation component; and a thermal management system comprising:

a cooling component in fluid communication with the thermal dissipation component;

a first panel coupled to a first side of the first computing component;

a second panel coupled to a second side of the first computing component opposite the first side of the first computing component, the second panel also coupled to a first side of the second computing component; and a third panel coupled to a second side of the second computing component opposite the first side of the second computing component, wherein the first panel is mechanically coupled to the second panel such that the first panel abuts the second panel, and the second panel is mechanically coupled to the third panel such that the second panel abuts the third panel;

wherein the first panel, the second panel, and the third panel are thermally coupled to the cooling component.

13. The computing device of claim 12, wherein:

the first panel comprises:

a first side including a first substantially planar plate portion and a first lip portion protruding from the first side of the first panel along at least a portion of an edge of the first substantially planar plate portion, wherein the first substantially planar plate portion is positioned adjacent to the first side of the first computing component and the first lip portion is positioned above a top of the first computing component; and a second side opposite the first side, the second side including a second substantially planar plate portion and a second lip portion protruding from the second side of the first panel along at least a portion of an edge of the second substantially planar plate portion; and the second panel comprises a third substantially planar plate portion and a third lip portion protruding from a side of the second panel along at least a portion of an edge of the third substantially planar plate portion, wherein the third substantially planar plate portion is positioned adjacent to the second side of the first computing component, wherein the first panel is coupled to the second panel.

14. The computing device of claim 13, wherein the first panel and the second panel are coupled such that the first lip portion and third lip portion create a gap between the first substantially planar plate portion of the first panel and the third substantially planar plate portion of the second panel to accommodate the first computing component.

15. The computing device of claim 13, wherein the first panel provides a thermally conductive path between the first computing component and a structure of the computing device, the thermally conductive path providing a higher thermally conductivity then if the first substantially planar plate portion of the first panel was not positioned adjacent to the first side of the first computing component.

16. The computing device of claim 12, further comprising a vibration dampening material disposed between the first panel and the first computing component.

17. The computing device of claim 12, wherein the first panel is coupled to the second panel via elongated members spaced apart to accommodate a length of a side of the first computing component therebetween.

18. The computing device of claim 12, wherein at least one of the first computing component or the second computing component is a memory module.

19. A thermal management system comprising:

a cooling component;

a first panel;

a second panel mechanically coupled to the first panel such that a first portion of the second panel abuts the first panel and a second portion of the second panel is spaced from the first panel to form a first space to receive a first computing component; and a third panel mechanically coupled to the second panel such that a first portion of the third panel abuts the second panel and a second portion of the third panel is spaced from the second panel to form a second space to receive a second computing component, wherein the first panel, the second panel, and the third panel are thermally coupled to the cooling component.

20. The thermal management system of claim 19, wherein:

the first panel comprises:

a first side including a first substantially planar plate portion and a first lip portion protruding from the first side of the first panel along at least a portion of an edge of the first substantially planar plate portion, wherein the first substantially planar plate portion is positioned adjacent to the first space and the first lip portion is positioned above a top of the first space; and a second side opposite the first side, the second side including a second substantially planar plate portion and a second lip portion protruding from the second side of the first panel along at least a portion of an edge of the second substantially planar plate portion; and the second panel comprises a third substantially planar plate portion and a third lip portion protruding from a side of the second panel along at least a portion of an edge of the third substantially planar plate portion, wherein the third substantially planar plate portion is positioned adjacent to the second space.

* * * * *